US006913986B2

(12) United States Patent
Nishitani et al.

(10) Patent No.: US 6,913,986 B2
(45) Date of Patent: Jul. 5, 2005

(54) METHOD AND APPARATUS FOR FABRICATING A THIN FILM AND THIN FILM TRANSISTOR AND METHOD OF FABRICATING SAME

(75) Inventors: Mikihiko Nishitani, Nara (JP); Masashi Goto, Katano (JP)

(73) Assignee: Matsushita Electric Industrial Co., Ltd. (JP)

( * ) Notice: Subject to any disclaimer, the term of this patent is extended or adjusted under 35 U.S.C. 154(b) by 203 days.

(21) Appl. No.: 10/240,570

(22) PCT Filed: Apr. 4, 2001

(86) PCT No.: PCT/JP01/02912

§ 371 (c)(1), (2), (4) Date: Oct. 3, 2002

(87) PCT Pub. No.: WO01/75953

PCT Pub. Date: Oct. 11, 2001

(65) Prior Publication Data

US 2003/0143784 A1 Jul. 31, 2003

(30) Foreign Application Priority Data

Apr. 4, 2000 (JP) ....................................... 2000-101935
Aug. 17, 2000 (JP) ....................................... 2000-247351

(51) Int. Cl.[7] .......................... H01L 21/20; H01L 21/00
(52) U.S. Cl. ....................................... 438/487; 438/166
(58) Field of Search ................................ 438/486, 487, 438/166; 117/8

(56) References Cited

U.S. PATENT DOCUMENTS 4,751,193 A * 6/1988 Myrick ........................ 117/44
4,822,751 A 4/1989 Ishizu et al. ................ 438/164
4,984,033 A 1/1991 Ishizu et al. .................. 257/98
4,986,214 A * 1/1991 Zumoto et al. ............. 118/722
5,505,779 A * 4/1996 Mizuno et al. ............. 118/719
5,608,232 A * 3/1997 Yamazaki et al. ............ 257/66
5,693,541 A 12/1997 Yamazaki et al. .......... 438/486
5,843,225 A 12/1998 Takayama et al. ............. 117/8
6,329,229 B1 * 12/2001 Yamazaki et al. .......... 438/166
6,602,765 B2 * 8/2003 Jiroku et al. ................ 438/487
6,610,142 B1 8/2003 Takayama et al. ............. 117/8

FOREIGN PATENT DOCUMENTS

| | | |
|---|---|---|
| JP | 62-232966 | 10/1987 |
| JP | 2-307221 | 12/1990 |
| JP | 6-77259 | 3/1994 |
| JP | 6-97193 | 4/1994 |
| JP | 6-232059 | 8/1994 |
| JP | 7-50263 | 2/1995 |
| JP | 8-64545 | 3/1996 |
| JP | 8-316152 | 11/1996 |

OTHER PUBLICATIONS

T. Sameshima et al., "XeCl Excimer Laser Annealing Used in the Fabrication of Poly–Si TFT's", IEEE Electron Device Letters, vol. EDL–7. No. 5, May 1986, pp. 276–278.
A. Kohno et al., "High Performance Poly–Si TFTs Fabricated Using Pulsed Laser Annealing and Remote Plasma CVD with Low Temperature Processing", IEEE Transactions on Electron Devices, vol. 42, No. 2, Feb. 1995, pp. 251–257.

* cited by examiner

*Primary Examiner*—Matthew Smith
*Assistant Examiner*—Lex H. Malsawma
(74) *Attorney, Agent, or Firm*—Parkhurst & Wendel, L.L.P.

(57) ABSTRACT

A method of fabricating a thin film includes: forming, on a substrate, a thin film with film properties varying from region to region on the substrate, by selectively heating the substrate; and patterning the thin film in a predetermined pattern by etching the thin film to selectively remove only a portion of the thin film with specified film properties. The method reduces the fabrication process temperature and the number of fabrication steps, while inhibiting degradation in device performance.

44 Claims, 19 Drawing Sheets

METHOD AND APPARATUS FOR FABRICATING A THIN FILM AND THIN FILM TRANSISTOR AND METHOD OF FABRICATING SAME

TECHNICAL FIELD

The present invention relates to a method and apparatus for fabricating a thin film, and a thin film transistor used in liquid crystal display devices, organic EL devices, and the like as the switching element or the like, and a method of fabricating such a thin film transistor.

BACKGROUND ART

A hydrogenated amorphous silicon thin film (hereinafter referred to as a-Si:H thin film) has been put to practical use as a pixel switching transistor for liquid crystal displays, as an optical sensor serving as an image sensor for facsimile machines, as a solar cell used as a battery for calculators, and the like. The biggest advantage of this a-Si:H thin film is that the film can be fabricated stably on a large-area substrate with good reproducibility at a process temperature of only about 300° C. However, with an increase in pixel density in liquid crystal displays and image sensors, silicon semiconductor thin films compatible with a faster drive have been demanded. Conventional transistors using an a-Si:H thin film had a mobility of 1.0 $cm^2/V \cdot sec$ at most, and thus did not have sufficient performance to satisfy the demand. Thus, in order to improve mobility, development of techniques for crystallizing a-Si:H thin films has been pursued. Methods for the crystallization include, for example, the following techniques.

1) Depositing a thin film on a substrate by plasma enhanced CVD, using a source gas in which hydrogen or $SiF_4$ is mixed in silane gas, and then crystallizing the thin film.

2) Using an a-Si thin film as a precursor, attempting to crystallize the a-Si thin film.

Of these techniques, the crystallization method described in the technique 2) includes, for example, a solid phase growth technique, in which heat treatment is performed at about 600° C. for an extended period of time, and an excimer laser annealing technique.

With, in particular, the latter excimer laser annealing technique, a polycrystalline silicon thin film with high mobility (>100 $cm^2/W \cdot sec$) has been successfully obtained without the need to actively increase the substrate temperature. This fact is described in detail, for example, in IEEE Electron Device Letters, 7 (1986), pp. 276–278 and IEEE Transactions on Electron Devices, 42 (1995), pp. 251–257.

When a TFT of the above-described a-Si:H thin film or polycrystalline silicon thin film is used, as the switching transistor, in the pixel portion of a liquid crystal display, an ON current is required which is sufficient to write signals applied to the TFT to the liquid crystal (layer) within a given time period, and in addition a reduction of leakage current in an OFF state is required. Further, in a built-in type liquid crystal display having a drive circuit provided on the periphery of the substrate, when a TFT of the polycrystalline silicon thin film is used in the drive circuit, the performance and reliability of each TFT need to be sufficiently assured as a circuit element.

In order to satisfy these requirements, for example, in a TFT having an a-Si:H thin film, the source region and the drain region are doped with impurities so as to reduce leakage current. In addition, in a TFT having a polycrystalline silicon thin film, an offset structure or an LDD structure is employed so as to maintain the performance and reliability of the TFT, and at the same time, to reduce so-called leakage current in an OFF state. (Note that the term "offset structure" refers to a structure in which appropriate space (for example, 0.5 μm) is provided between the channel portion (which is located immediately below the gate electrode in the case of a top-gate type TFT) and each of the source and drain regions of the semiconductor, and that the term "LDD structure" refers to a structure in which between the channel portion (which is located immediately below the gate electrode) and each of the source and drain regions of the semiconductor a doping region is provided in which impurities with a lower concentration than those of the source and drain regions are diffused.)

Future demands in, for example, liquid crystal displays would be for low cost and image quality (for example, a display grade having a resolution such as that of photo image quality), and the like. For satisfying such demands, very fine pixels and fast operation of an in-built drive circuit are, of course, required in liquid crystal displays, and technically, fabrication of an extremely small TFT becomes an important and essential technique.

If an extremely small TFT is realized, it is possible in, for example, a TFT used in the pixel portion (hereinafter referred to as TFT for a pixel) to further increase the aperture ratio of the pixel, reduce the capacity level of parasitic capacity, improve image quality, and increase driving speed. In addition, in a TFT used in an in-built drive circuit (hereinafter referred to as TFT for a drive circuit), the capacity level of parasitic capacity is reduced, achieving an even faster drive.

Note, however, that fabrication of an extremely small TFT is accompanied by other problems to overcome. One of the problems in view of the TFT for a pixel is that it is necessary to further reduce a leakage current in an OFF state of about $10^{-12}$ A, which is conventionally obtained, by one digit or more to reduce the brightness difference in the plane of the panel. If this problem is not overcome, even if an extremely small TFT reduces an area per pixel and a storage capacity portion for storing an electric charge of signals, it becomes difficult to realize a bright display without causing a reduction in aperture ratio. In addition, as for the foregoing problems in view of the TFT for a drive circuit, in employing the above-described offset structure or LDD structure, factors in fabrication such as fine processing accuracy and alignment accuracy for photolithography become critical limitations. Further, since the offset structure and the LDD structure require stable characteristics and also require the structure to be self-aligned, the fabrication process becomes more complicated, causing an increase in costs.

Moreover, a TFT for a pixel or a TFT for a drive circuit used in liquid crystal displays, a display and image-input integrated panel, an optical sensor serving as an image sensor used in facsimile machines, a solar cell used as a battery for calculators, or the like is expected to be developed, with use of a flexible substrate (made of plastic or the like), to a ultra-thin flexible input and output panel capable of connecting to an electronic paper and a network (Internet). Thus, such a flexible substrate also requires techniques for fabricating a thin film transistor, an optical sensor, a solar cell, and the like with excellent characteristics at low cost.

However, provision of TFTs and the like on the flexible substrate requires techniques for fabricating extremely small TFTs on the flexible substrate and improvement in reliability. In addition, because the flexible substrate is inferior in heat resistance to, for example, a glass substrate, the fabrication process temperature needs to be reduced. Moreover, in order to cut fabrication cost, the number of fabrication steps needs to be reduced.

To summarize the above, conventional TFTs have problems described below.

(i) A complicated fabrication process and an increase in costs resulting from the fabrication of extremely small TFTs.

(ii) A reduction in reliability of TFTs resulting from the fabrication of extremely small TFTs.

(iii) A high process temperature upon formation of TFTs on a flexible substrate or the like.

DISCLOSURE OF THE INVENTION

The present invention has been made so as to overcome the foregoing and other problems. An object of the present invention is to reduce the fabrication process temperature and the number of fabrication steps, while inhibiting degradation in device performance.

(Methods of Fabricating a Thin Film)

(1) In order to overcome the foregoing problems, there is provided a method of fabricating a thin film according to the present invention comprising: forming a thin film on a substrate, the thin film with film properties varying from region to region on the substrate being formed by selectively heating the substrate; and patterning the thin film in a predetermined pattern by etching the thin film to selectively remove only a portion of the thin film with specified film properties.

With the above-described method, a reduction in process temperature and a reduction in processing steps are achieved. That is, in forming a thin film according to the above-described method, the entire surface of the substrate is not heated but only a portion of the substrate necessary for film formation is selectively heated. Thus, a significant increase in substrate temperature can be prevented, reducing the process temperature.

In addition, the reason for selectively heating the substrate is to cause a temperature distribution on the substrate surface. In doing so, the temperature conditions vary from region to region on the substrate, and consequently a thin film with film properties varying from region to region is formed on the substrate. For example, when there are formed, on the substrate, a region with a high temperature and a region with a low temperature by selectively heating the substrate, it is possible to vary the film properties between a portion corresponding to the region with a high temperature and a portion corresponding to the region with a low temperature. Here, the variation in film properties appears as differences in the etching rate upon etching of the thin film. Specifically, in the comparison of the etching rate between the portion corresponding to the region with a high temperature and the portion corresponding to the region with a low temperature, the former has a lower etching rate. Therefore, even if the etching of the thin film is performed under the same conditions, only the portion corresponding to the region with a low temperature is selectively removed. Hence, according to the above-described method, a thin film with a predetermined pattern can be formed without using a mask, and the processing steps such as photolithography conventionally required can be reduced.

(2) In addition, in order to overcome the foregoing problems, there is provided another method of fabricating a thin film according to the present invention comprising: depositing a thin film on a substrate, the thin film being deposited only in a specified region by selectively heating the substrate to vary a deposition rate from region to region on the substrate.

With the above-described method, as is the case with the method (1), in forming a thin film, the entire surface of the substrate is not heated but only a portion of the substrate necessary for film formation is selectively heated, and thus a reduction in process temperature is achieved.

As for thin film deposition, in the case, for example, of employing chemical techniques such as CVD, film deposition needs to be performed with the substrate surface having been set to a temperature equal to or above a given temperature. For this reason, a region of the substrate not reaching the above-described temperature cannot obtain a deposition rate required for deposition on the substrate. Thus, when the substrate is selectively heated in the manner described in the above-described method, only a region on the substrate having been heated obtains a deposition rate required for film formation, and therefore a thin film can be deposited only such a region. Consequently, a thin film with a predetermined pattern can be formed without performing a lithography step conventionally required when patterning a thin film, which in turn reduces the number of fabrication steps, resulting in a reduction in costs.

In the above-described methods (1) and (2), the substrate may be selectively heated by forming, on the substrate, an energy absorber or an energy absorber with a predetermined pattern, and subsequently imparting energy to the energy absorber to release heat from the energy absorber. Here, the energy absorber refers to as a substance that absorbs thermal energy, electromagnetic energy, or the like and then releases such energy in the form of heat.

Furthermore, the energy may be imparted by irradiating an electromagnetic wave to the energy absorber. An example of the electromagnetic wave includes light.

Moreover, in the above-described methods (1) and (2), the substrate may be selectively heated by forming, on the substrate, a conductive film or a conductive film with a predetermined pattern, and subsequently passing an electric current through the conductive film to release heat from the conductive film.

In addition, it is preferable that the substrate be selectively heated intermittently. When the substrate is heated continuously for a certain period of time, the temperature difference between a region with a high temperature and a region with a low temperature on the substrate surface is made small, making it impossible to make a clear difference between the two different regions On the other hand, when the substrate is heated intermittently, because of the characteristics of the energy absorber that releases absorbed energy as heat, the temperature difference between the two different regions can be made clearly. Thus, it is possible to clearly vary the film properties of a thin film to be formed on the substrate, obtaining a desired pattern, while preventing the formation of an abnormal pattern.

Furthermore, in the step of forming the thin film according to the above-described method (1) and in the step of depositing the thin film according to the above-described method (2), it is preferable to employ CVD. Further, in the above-described method (1), among the CVD techniques, it is more preferable to employ plasma enhanced CVD.

(Methods of Fabricating a Thin Film Transistor)

(1) In order to overcome the foregoing problems, there is provided a method of fabricating a thin film transistor according to the present invention comprising: forming, on an insulating substrate, a metal thin film with a predetermined pattern; forming an insulating layer on the metal thin film; forming a semiconductor thin film on the insulating layer, the semiconductor thin film with film properties varying between a region above and in the vicinity of the metal thin film and other regions being formed by imparting energy to the metal thin film to release the energy as heat from the metal thin film so that the insulating layer is selectively heated; and patterning the semiconductor thin film in a predetermined pattern by etching the semiconductor thin film to selectively remove the other regions.

With the above-described method, when forming a semiconductor thin film, only a portion of the insulating substrate necessary for film formation is selectively heated, and thus a significant increase in substrate temperature can be prevented, reducing the process temperature. Consequently, it is also possible to form a thin film transistor, for example, on a flexible substrate.

In addition, with the above-described method, a semiconductor thin film with film properties varying from region to region can be formed, and thus even if etching is performed under the same conditions, only a specified portion can be selectively removed. Consequently, a semiconductor thin film with a predetermined pattern can be formed without using a mask, achieving a reduction in fabrication costs.

(2) Furthermore, in order to overcome the foregoing problems, there is provided another method of fabricating a thin film transistor according to the present invention comprising: forming, on an insulating substrate, a metal thin film with a predetermined pattern; forming an insulating layer on the metal thin film; and depositing a semiconductor thin film on the insulating layer, the semiconductor thin film being deposited only in a specified region by imparting energy to the metal thin film to release the energy as heat from the metal thin film so that the insulating layer is selectively heated, thereby varying a deposition rate from region to region on the insulating layer.

With the above-described method, as is the case with the method (1), in forming a semiconductor thin film, the entire surface of the insulating substrate is not heated but only a portion of the substrate necessary for film formation is selectively heated, and thus a reduction in process temperature is achieved.

In addition, in the above-described method, the selective heating of the insulating substrate allows to vary deposition conditions from region to region on the insulating substrate. Consequently, a semiconductor thin film can be deposited only in a desired region, and thus a semiconductor thin film with a predetermined pattern can be formed without performing a lithography step conventionally required. Thus, the number of fabrication steps is reduced, resulting in a reduction in costs.

In the above-described methods (1) and (2), the metal thin film may serve as a gate electrode or a source electrode and a drain electrode.

In addition, the insulating layer may be selectively heated by irradiating an electromagnetic wave, serving as the energy, to the metal thin film to release heat from the metal thin film.

In the above-described methods (1) and (2), the insulating layer may be selectively heated by passing an electric current through the metal thin film to release heat from the metal thin film.

Further, in the above-described methods (1) and (2), it is preferable that the energy be imparted to the metal thin film intermittently. When the substrate is heated continuously for a certain period of time, the temperature difference between a region with a high temperature and a region with a low temperature on the substrate surface is made small, making it impossible to make a clear difference between the two different regions. On the other hand, when the substrate is heated intermittently, the temperature difference between the two different regions can be made clearly, and accordingly it is possible to clearly vary the film properties of a semiconductor thin film to be formed on the substrate. Consequently, a pattern of the semiconductor thin film obtained after etching can be made distinctly.

In the above-described methods (1) and (2), in the step of forming the thin film, it is preferable to employ CVD. Further, among the CVD techniques, it is more preferable to employ plasma enhanced CVD.

Moreover, in the above-described methods (1) and (2), after the step of depositing the semiconductor thin film, the semiconductor thin film may be crystallized.

In addition, laser annealing may be performed instead of the heat treatment.

(3) Moreover, in order to overcome the foregoing problems, there is provided still another method of fabricating a thin film transistor according to the present invention comprising: forming, on an insulating substrate, a metal thin film with a predetermined pattern; forming a first semiconductor thin film on the insulating substrate with the insulating substrate being selectively heated by imparting energy to the metal thin film to release the energy as heat from the metal thin film, the first semiconductor thin film having film properties varying between a portion covering the metal thin film and other portions; patterning the first semiconductor thin film by etching the first semiconductor thin film to selectively remove only the other portions, thereby covering only the metal thin film; forming, on the insulating substrate having the first semiconductor thin film thereon, a second semiconductor thin film with a higher melting point than the first semiconductor thin film; and crystallizing the second semiconductor thin film by heat treatment with the first semiconductor thin film as growth nucleus.

(4) In order to overcome the foregoing problems, there is provided yet another method of fabricating a thin film transistor according to the present invention comprising: forming, on an insulating substrate, a metal thin film with a predetermined pattern; depositing a first semiconductor thin film so as to cover the metal thin film, the first semiconductor thin film being deposited only on top and side surfaces of the metal thin film, by imparting energy to the metal thin film to release the energy as heat from the metal thin film so that a deposition rate varies between a region in the vicinity of the metal thin film and other regions; forming, on the insulating substrate having the first semiconductor thin film thereon, a second semiconductor thin film with a higher melting point than the first semiconductor thin film; and crystallizing the second semiconductor thin film by heat treatment with the first semiconductor thin film as growth nucleus.

(5) In order to overcome the foregoing problems, there is provided another method of fabricating a thin film transistor according to the present invention comprising: forming, on an insulating substrate, a metal thin film with a predetermined pattern; forming an insulating layer on the insulating substrate having the metal thin film thereon; forming a first semiconductor thin film on the insulating layer, the first semiconductor thin film with film properties varying from region to region on the insulating layer being formed by imparting energy to the metal thin film to release the energy as heat from the metal thin film so that the insulating layer is selectively heated; patterning the first semiconductor thin film in a predetermined pattern by etching the first semiconductor thin film to selectively remove only a portion of the first semiconductor thin film with specified film properties; forming, on the insulating substrate having the first semiconductor thin film thereon, a second semiconductor thin film with a higher melting point than the first semiconductor thin film; and crystallizing the second semiconductor thin film by heat treatment with the first semiconductor thin film as growth nucleus.

(6) In order to overcome the foregoing problems, there is provided still another method of fabricating a thin film transistor according to the present invention comprising: forming, on an insulating substrate, a metal thin film with a predetermined pattern; forming an insulating layer on the insulating substrate having the metal thin film thereon; depositing a first semiconductor thin film on the insulating layer, the first semiconductor thin film being deposited only in a specified region by imparting energy to the metal thin film to release the energy as heat from the metal thin film so that the insulating layer is selectively heated, thereby varying a deposition rate from region to region on the insulating layer; forming, on the insulating substrate having the first semiconductor thin film thereon, a second semiconductor thin film with a higher melting point than the first semiconductor thin film; and crystallizing the second semiconductor thin film by heat treatment with the first semiconductor thin film as growth nucleus.

In the above-described methods (3) to (6), the metal thin film may serve as a gate electrode or a source electrode and a drain electrode. Specifically, when the metal thin film serves as the gate electrode, in the above-described methods, a bottom-gate type thin film transistor can be fabricated. On the other hand, when the metal thin film serves as the source electrode and the drain electrode, in the above-described methods, a top-gate type thin film transistor can be fabricated.

Furthermore, in the above-described methods (3) to (6), the insulating layer may be selectively heated by irradiating an electromagnetic wave, serving as the energy, to the metal thin film to release heat from the metal thin film.

In the above-described methods (3) to (6), the insulating layer may be selectively heated by passing an electric current through the metal thin film to release heat from the metal thin film.

In the above-described methods (3) to (6), it is preferable that the energy be imparted to the metal thin film intermittently.

In the above-described methods (3) to (6), in the step of forming the thin film, it is preferable to employ CVD. Further, among the CVD techniques, it is more preferable to employ plasma enhanced CVD.

In the above-described methods (3) to (6), after the step of forming the semiconductor thin film, the semiconductor thin film may be crystallized.

(Apparatus for Fabricating a Thin Film)

(1) In order to overcome the foregoing problems, there is provided an apparatus for fabricating a thin film according to the present invention comprising: a metal thin film formation means for forming, on a substrate, a metal thin film with a predetermined pattern; a thin film formation means for forming a thin film on the substrate, the thin film with film properties varying from region to region on the substrate being formed by imparting energy to the metal thin film to release the energy as heat from the metal thin film so that the substrate is selectively heated; and an etching means for patterning the thin film in a predetermined pattern by etching the thin film to selectively remove only a portion of the thin film with specified film properties.

(2) In addition, in order to overcome the foregoing problems, there is provided another apparatus for fabricating a thin film according to the present invention comprising: a metal thin film formation means for forming, on a substrate, a metal thin film with a predetermined pattern; and a thin film formation means for forming a thin film on the substrate, the thin film being formed only in a specified region by imparting energy to the metal thin film to release the energy as heat from the metal thin film so that the substrate is selectively heated, thereby varying a deposition rate from region to region on the substrate.

In the above-described configurations (1) and (2), the thin film formation means may comprise: a reaction vessel for holding the substrate inside; an electromagnetic wave irradiation portion for irradiating an electromagnetic wave, serving as the energy, to the metal thin film; a supply portion for supplying a source gas to an inside of the reaction vessel; and a reaction excitation portion for exciting a chemical reaction of the source gas.

(Thin Film Transistors)

(1) In order to overcome the foregoing problems, there is provided a thin film transistor according to the present invention comprising: a metal thin film having a predetermined pattern and provided on an insulating substrate; an insulating layer provided on the insulating substrate having the metal thin film thereon; and a semiconductor thin film having a predetermined pattern and provided on the insulating layer, wherein the semiconductor thin film is patterned in the predetermined pattern by forming the semiconductor thin film by imparting energy to the metal thin film to release the energy as heat from the metal thin film so that the insulating layer is selectively heated, thereby varying film properties between a region above and in the vicinity of the metal thin film and other regions, and subsequently etching the semiconductor thin film to selectively remove the other regions.

(2) In addition, in order to overcome the foregoing problems, there is provided another thin film transistor according to the present invention comprising: a metal thin film having a predetermined pattern and provided on an insulating substrate; an insulating layer provided on the insulating substrate having the metal thin film thereon; and a semiconductor thin film having a predetermined pattern and provided on the insulating layer, wherein the semiconductor thin film is deposited only in a specified region by imparting energy to the metal thin film to release the energy as heat from the metal thin film so that the insulating layer is selectively heated, thereby varying a deposition rate from region to region on the insulating layer.

Furthermore, in the above-described methods (1) and (2), a sidewall of the semiconductor thin film may have a gently sloping shape. With conventional etching, the sidewall is perpendicular to the substrate surface and there is much of a step height between the semiconductor thin film and the insulating layer. Thus, when, for example, a source electrode, a drain electrode, and the like are formed on the semiconductor thin film, disconnection may occur due to the step height. However, as in the above-described configurations, when the sidewall of the semiconductor thin film has a gently sloping shape, it is possible to minimize occurrence of disconnection.

(3) In order to overcome the foregoing problems, there is provided still another thin film transistor according to the present invention comprising: a metal thin film patterned on an insulating substrate in a predetermined pattern; a first semiconductor thin film deposited so as to cover the metal thin film, the first semiconductor thin film being provided so as to cover only the metal thin film, by imparting energy to the metal thin film to release the energy as heat from the metal thin film, thereby providing the first semiconductor thin film with film properties varying between a portion covering the metal thin film and other regions, and subsequently selectively removing the other portions by etching; and a second semiconductor thin film provided on the insulating substrate having the first semiconductor thin film thereon, and having a higher melting point than the first semiconductor thin film, the second semiconductor thin film being crystallized by heat treatment with the first semiconductor thin film as growth nucleus, wherein a region of the crystallized second semiconductor thin film not having the first semiconductor thin film serves as a channel portion.

(4) Moreover, in order to overcome the foregoing problems, there is provided yet another thin film transistor according to the present invention comprising: a metal thin film patterned on an insulating substrate in a predetermined pattern; a first semiconductor thin film deposited so as to cover the metal thin film, the first semiconductor thin film being deposited on top and side surfaces of the metal thin film, by imparting energy to the metal thin film to release the energy as heat from the metal thin film so that a deposition rate varies between a region in the vicinity of the metal thin film and other regions; a second semiconductor thin film provided on the insulating substrate having the first semiconductor thin film thereon, and having a higher melting point than the first semiconductor thin film, the second semiconductor thin film being crystallized by heat treatment with the first semiconductor thin film as growth nucleus, wherein a region of the crystallized second semiconductor thin film not having the first semiconductor thin film serves as a channel portion.

Furthermore, in order to overcome the foregoing problems, there is provided another thin film transistor according to the present invention comprising: a metal thin film patterned on an insulating substrate in a predetermined pattern; an insulating layer provided on the insulating substrate having the metal thin film thereon; a first semiconductor thin film formed on the insulating layer with the insulating layer being selectively heated by imparting energy to the metal thin film to release the energy as heat from the metal thin film, thereby varying film properties of the first semiconductor thin film between a portion corresponding to a region with a high surface temperature of the insulating layer and a portion corresponding to a region with a low surface temperature of the insulating layer, the first semiconductor thin film being provided only in the region with a high surface temperature, by etching the first semiconductor thin film to selectively remove the portion corresponding to the region with a low surface temperature; and a second semiconductor thin film provided on the insulating substrate having the first semiconductor thin film thereon, and having a higher melting point than the first semiconductor thin film, the second semiconductor thin film being crystallized by heat treatment with the first semiconductor thin film as growth nucleus, wherein a region of the crystallized second semiconductor thin film not having the first semiconductor thin film serves as a channel portion.

In order to overcome the foregoing problems, there is provided still another thin film transistor according to the present invention comprising: a metal thin film patterned on an insulating substrate in a predetermined pattern; an insulating layer provided on the insulating substrate having the metal thin film thereon; a first semiconductor thin film provided on the insulating layer, the insulating layer selectively heated by imparting energy to the metal thin film to release the energy as heat from the metal thin film so that a deposition rate varies between a region with a high surface temperature of the insulating layer and a region with a low surface temperature of the insulating layer, thereby providing the first semiconductor thin film only in the region with a high surface temperature; and a second semiconductor thin film provided on the insulating substrate having the first semiconductor thin film thereon, and having a higher melting point than the first semiconductor thin film, the second semiconductor thin film being crystallized by heat treatment with the first semiconductor thin film as growth nucleus, wherein a region of the crystallized second semiconductor thin film not having the first semiconductor thin film serves as a channel portion.

BRIEF DESCRIPTION OF THE DRAWINGS

FIG. 3(*a*) is a graph showing temperature distributions on the surface of the insulating layer, and FIG. 3(*b*) is a cross-sectional view showing the main part of the substrate.

FIG. 10(*a*) is a graph showing temperature distributions on a surface of an insulating layer, and FIG. 10(*b*) is a cross-sectional view showing the main part of the substrate.

FIG. 13(*a*) is a cross-sectional view for illustrating the formation of first and second semiconductor thin films, and FIG. 13(*b*) is a cross-sectional view for illustrating the crystallization of the second semiconductor thin film.

FIG. 14(*a*) is a cross-sectional view for illustrating the formation of first and second semiconductor thin films, and FIG. 14(*b*) is a cross-sectional view for illustrating the crystallization of the second semiconductor thin film.

BEST MODE FOR CARRYING OUT THE INVENTION

In the present invention, a thin film is formed with the substrate having a temperature distribution, thereby reducing the process temperature and enabling the formation of a thin film having a predetermined pattern without performing a lithography step using a mask.

A more specific description is as follows.

(1) The substrate surface is selectively heated to form a thin film with film properties varying from region to region. By taking advantage of differences in the etching rate caused by this variation in film properties, it is possible to perform patterning without performing a lithography step using a mask.

(2) The substrate surface is selectively heated so that the deposition rate itself varies from region to region. By taking advantage of differences in the deposition rate, a thin film is formed only in specific regions on the substrate without performing a lithography step.

Embodiment 1

Embodiment 1 corresponds to the case (1) described above. As a means for selectively heating the substrate surface, an energy absorber is utilized, making it possible to form a thin film with film properties varying from region to region.

The energy absorber according to the present embodiment functions such that when the energy absorber is irradiated with electromagnetic waves such as light, the energy absorber absorbs the electromagnetic waves as energy and further releases the energy as heat. An energy absorber having such a function can be formed, for example, of high melting point metals such as Mo, Ti, Cu, and Au.

Figure 1:
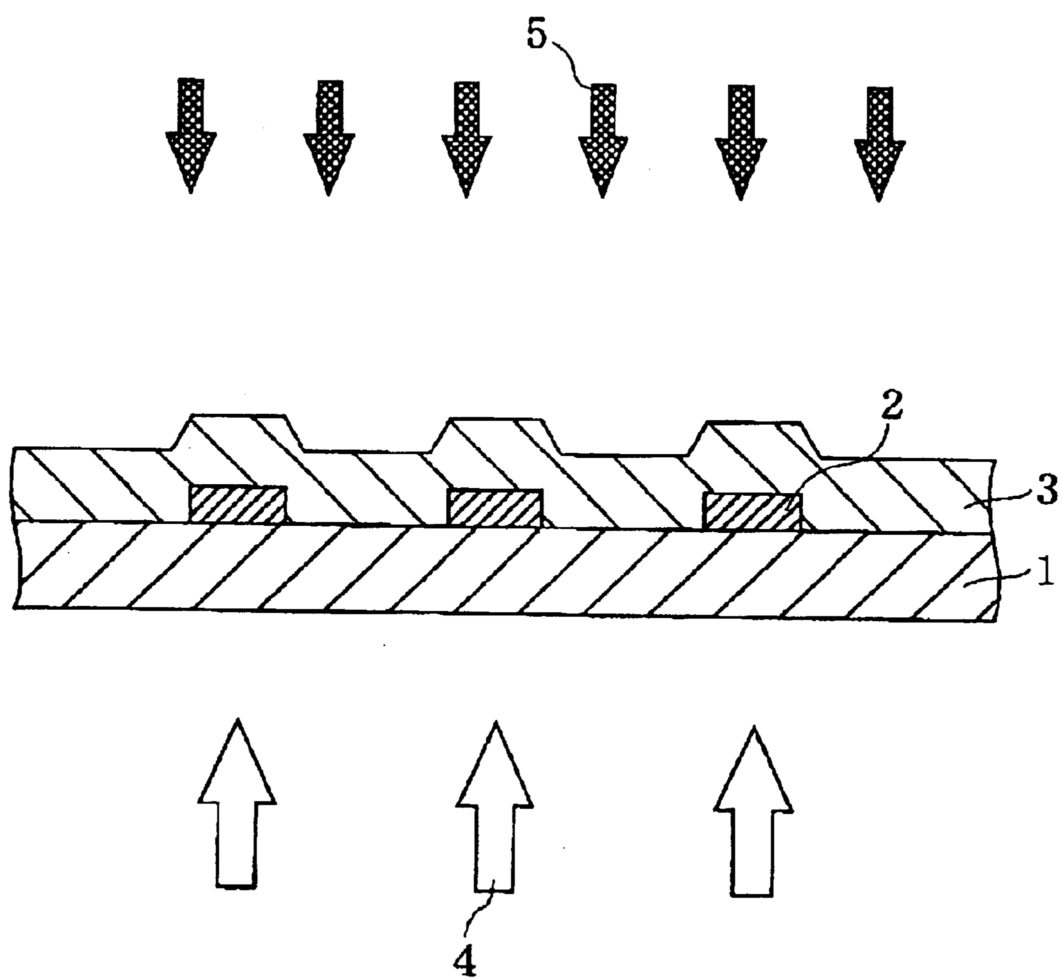
FIG. 1 is a cross-sectional view showing the fabrication step of a thin film according to Embodiment 1 of the present invention and illustrating the situation in which a surface of an insulating layer is selectively heated.

The energy absorber is formed as follows. Specifically, as shown in FIG. 1, on a substrate 1, being a glass substrate, a precursor film of energy absorbers 2 is formed by sputtering or the like, and then the film is patterned in a predetermined pattern to form the energy absorbers 2. For the patterning, photolithography, for example, can be employed.

Next, on the substrate 1 provided with the energy absorbers 2, an insulating layer 3 such as $SiO_2$ or $SiN_x$ is formed.

Figure 2:
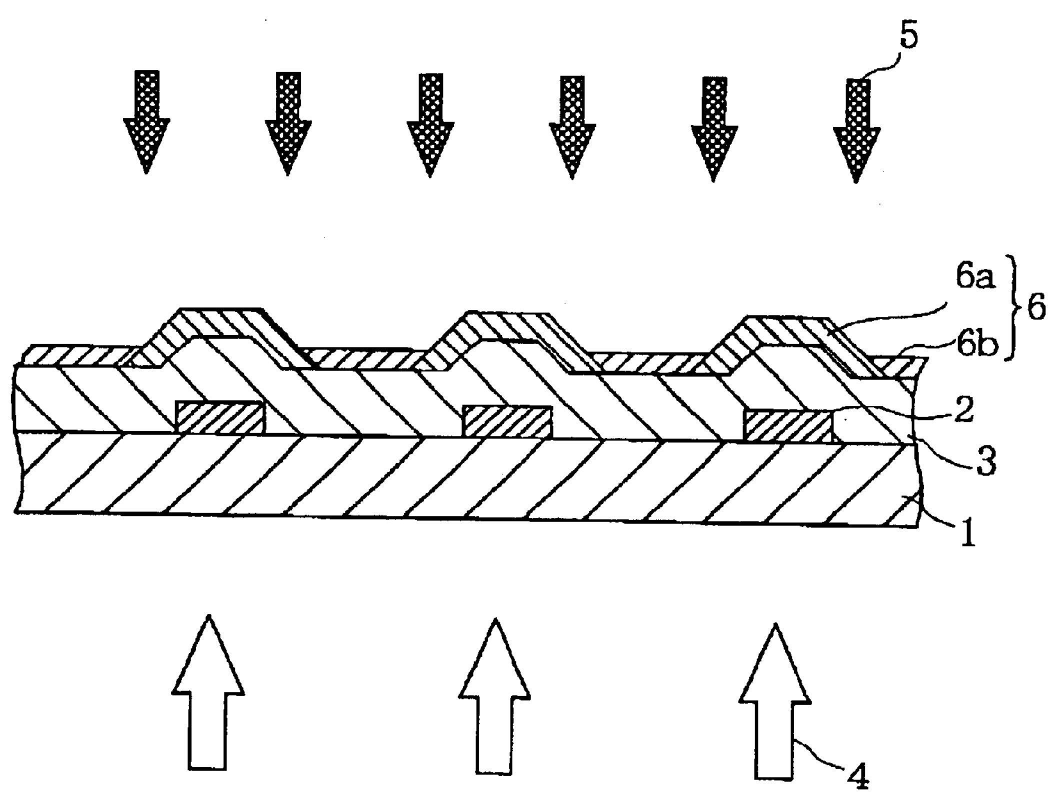
FIG. 2 is a cross-sectional view showing the fabrication step of the thin film according to Embodiment 1 and illustrating the situation in which a semiconductor thin film has been formed on the insulating layer.

Furthermore, as shown in FIG. 2, with the substrate 1 being heated, a semiconductor thin film 6 made of an a-Si thin film is formed on the insulating layer 3 by, for example, plasma enhanced CVD.

The heating of the substrate 1 is carried out, for example, as follows. Specifically, light 4 is irradiated onto the entire surface of the substrate 1 from the other side of the deposited surface of the substrate 1. As an energy source utilized for light irradiation, for example, a halogen lamp, a xenon lamp, or a metal halide lamp is utilized.

Figure 3A:
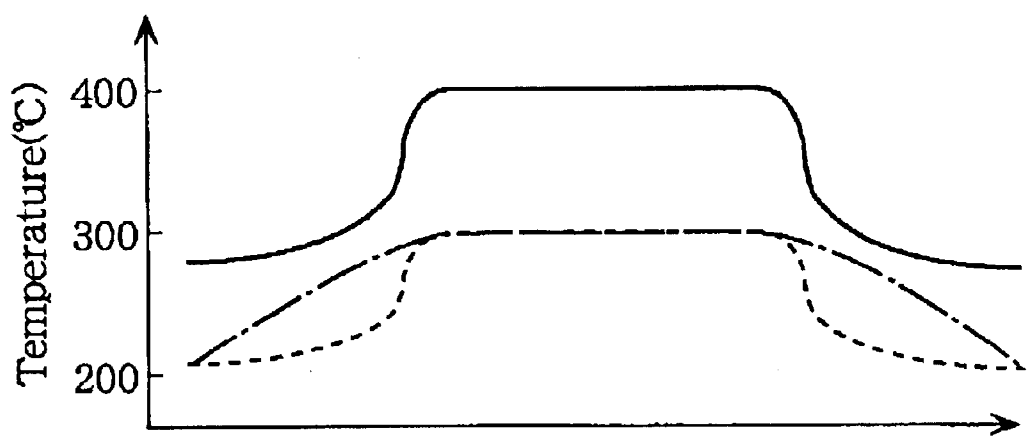
FIGS. 3(*a*) and (*b*) are diagrams for illustrating selective heating of a substrate, in a method of fabricating a thin film according to Embodiment 1.
Figure 3B:
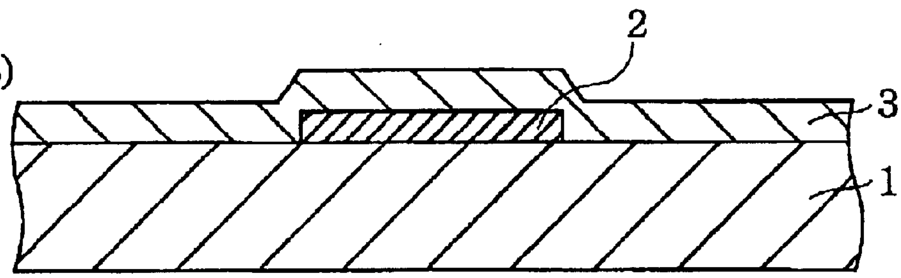
Figure 3B:
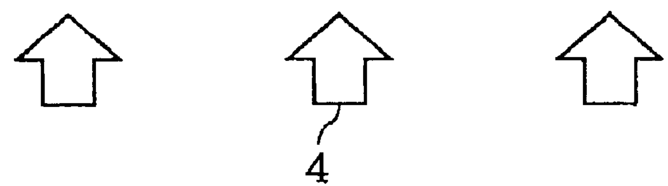

When the light 4 is irradiated onto the substrate 1, the energy absorbers 2 absorb the light 4 as light energy, and then release the light energy as heat. Thus, regions in the vicinity of the energy absorbers 2 have a higher temperature than other regions where the energy absorbers 2 are not provided. When this state is observed as the basis for the substrate temperature, roughly, such a temperature distribution as to be shown by the dotted line in FIG. 3(*a*) is obtained. FIG. 3(*a*) is a graph showing temperature distributions at the main part of the substrate 1 shown in FIG. 3(*b*) and showing the relationship between the length (μm) of the cross section of the substrate 1 and substrate temperature (° C.). As can be seen from FIG. 3(*a*), when the substrate temperature in regions where the energy absorbers 2 are present is set, for example, to about 300° C., the substrate temperature at locations, a few μm away from the energy absorbers 2 is about 200° C.

The reason for setting the substrate temperature in regions where the energy absorbers 2 are present to about 300° C. is related to the deposition process of the semiconductor thin film 6 made of an a-Si thin film. Specifically, in the case where the semiconductor thin film 6 is formed by, for example, plasma enhanced CVD, the deposition temperature needs to be set to about 300° C. Thus, the above-mentioned substrate temperature is only an exemplifying value, and therefore the substrate temperature should be changed and set in accordance with materials and deposition methods for a thin film to be formed. Note that the substrate temperature specifically means the surface temperature of the insulating layer 3. However, in the present invention, it is also possible to deposit a semiconductor thin film directly on the energy absorbers 2 without providing the insulating layer 3. In such a case, the substrate temperature means the surface temperature of the substrate 1 (the substrate temperature in regions where the energy absorbers 2 are present is the surface temperature of the energy absorbers 2).

Figure 4:
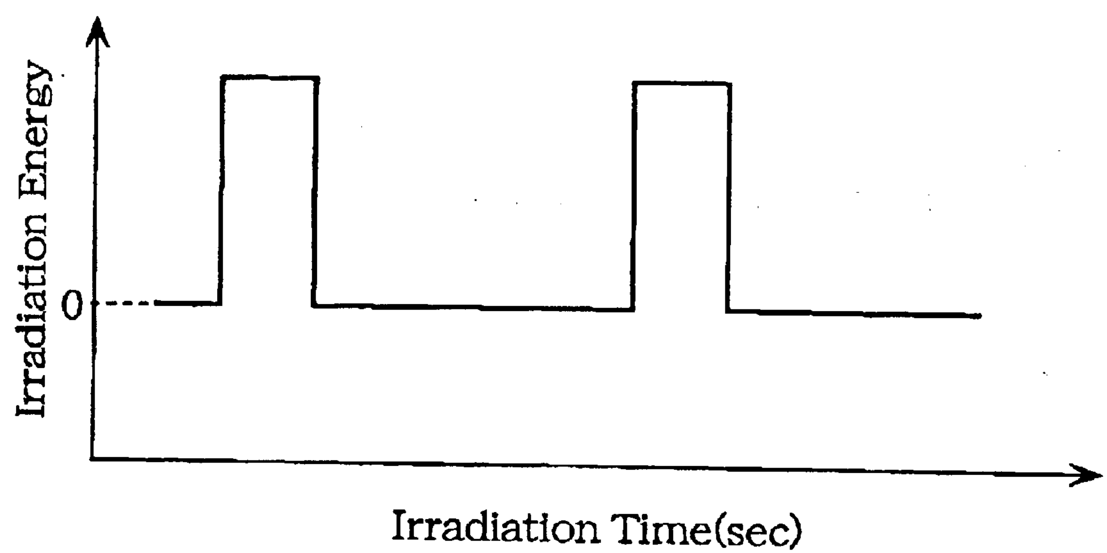
FIG. 4 is a graph showing the relationship between irradiation energy and irradiation time of light, in the method of fabricating a thin film according to Embodiment 1.

Methods of irradiating light onto the substrate 1 are not particularly limited; however, for example, as is shown in FIG. 4 showing the relationship between irradiation energy (J) and irradiation time (sec) of light, it is preferable to irradiate light intermittently at specified intervals. In doing so, it is possible to prevent the temperature distribution of the substrate 1 from making a smooth distribution curve, as shown by the dot-dash line in FIG. 3(*a*). Intermittent light irradiation can be performed by, for example, controlling the ON and OFF of the power source of the energy source.

With the surface of the substrate 1 thus having a temperature distribution, the semiconductor thin film 6 made of an a-Si thin film is formed on the insulating layer 3 by plasma enhanced CVD. As a flux 5 necessary for forming the semiconductor thin film 6, $SiH_4$ gas is utilized. When the $SiH_4$ is utilized, the $SiH_4$ is decomposed by the plasma and radicals of $SiH_x$ (X=0, 1, 2, 3) are generated. As a result, an a-Si thin film is formed. The supply of flux for deposition is made possible with such an equipment system that is capable of supplying a flux using a device configuration such as plasma enhanced CVD.

The film properties of the semiconductor thin film 6 deposited on the substrate 1 greatly depend on the power, operating pressure, gas flow rate, substrate temperature, and the like of plasma enhanced CVD. By optimizing the conditions of the power of plasma enhanced CVD and the supply of $SiH_4$ gas, it is possible to deposit, on the substrate 1 with a substrate temperature of 300° C., an a-Si thin film with excellent film properties, containing therein few $SiH_2$ bonds.

Figure 5:
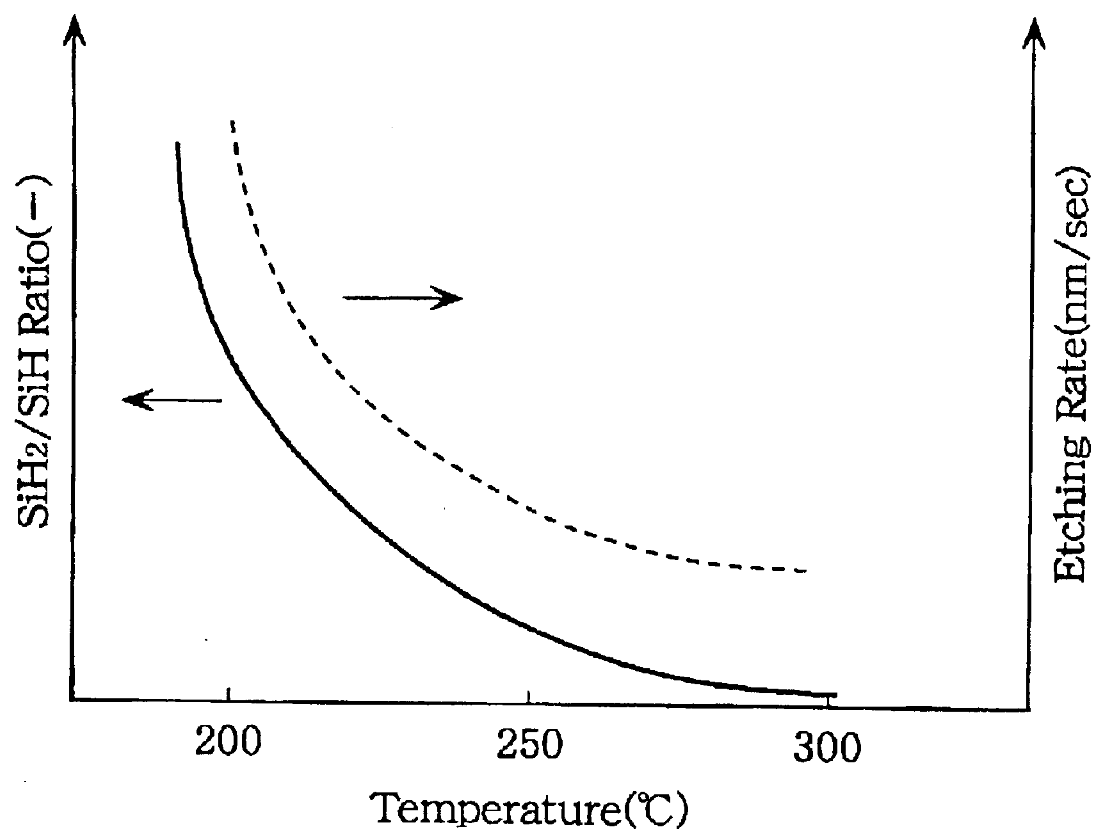
FIG. 5 is a graph showing the relationship between $SiH_2$/SiH ratio or etching rate and temperature on the surface of the insulating layer, in the method of fabricating a thin film according to Embodiment 1.

The variation of the film properties of an a-Si thin film was examined in the case, for example, where the substrate temperature was varied under the same plasma conditions, and as a result, a curve shown by the solid line in FIG. 5 was obtained. FIG. 5 is a graph showing the relationship between $SiH_2$/SiH ratio or etching rate (nm/sec) and substrate temperature (° C.). As can be seen from the graph, as the substrate temperature decreases, the $SiH_2$/SiH ratio increases. In addition, the graph shows that when the substrate temperature is 300° C., the $SiH_2$/SiH ratio is lowest. These results show that the a-Si film contains few $SiH_2$ bonds therein.

Thus, in the semiconductor thin film 6 formed on the insulating layer 3, the film properties vary between regions 6*a* formed on the energy absorbers 2 and regions 6*b* other than the regions 6*a*. Specifically, in the regions 6*a*, since the substrate temperature was about 300° C., the film in such regions contained few $SiH_2$ bonds and thus had film properties with many SiH bonds. On the contrary, in the regions 6*b*, the substrate temperature was about 200° C., and thus the film in such regions had film properties with numerous $SiH_2$ bonds.

Figure 6:
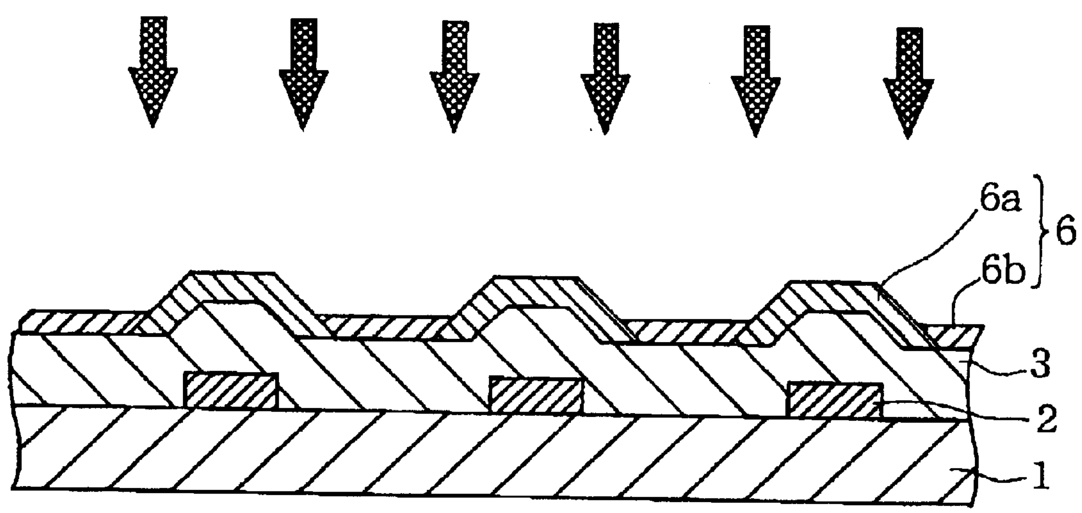
FIG. 6 is a cross-sectional view for illustrating etching of the semiconductor thin film, in the method of fabricating a thin film according to Embodiment 1.
Figure 7:
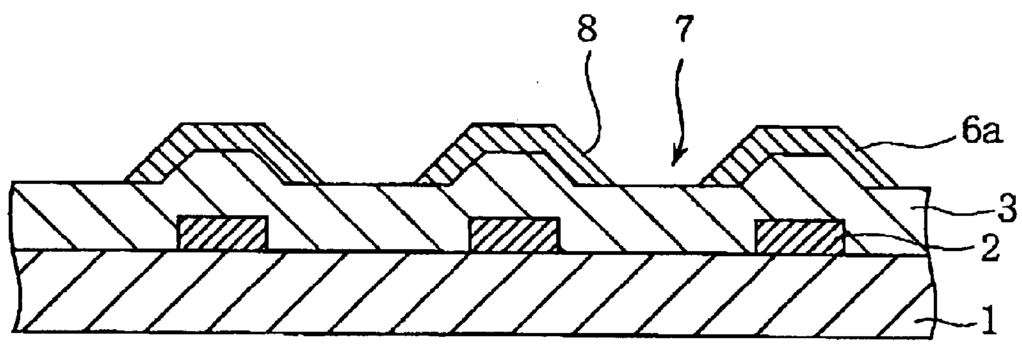
FIG. 7 is a cross-sectional view showing the semiconductor thin film fabricated by the method of fabricating a thin film according to Embodiment 1.

Next, the semiconductor thin film 6 is etched without performing a lithography step (see FIG. 6). As described above, the semiconductor thin film 6 is a thin film such that the film properties vary between the regions 6*a* and the regions 6*b*. This variation in film properties appears as differences in the etching rate upon etching. The relationship between the variation in film properties and etching rate can be clearly seen from the test results, as will be described below. Specifically, the etching rate for a-Si thin films deposited with different substrate temperatures was measured, and as a result, a curve shown by the dotted line in FIG. 5 was obtained. The measured values are obtained by hydrogen plasma treatment. As is clear from this graph, the etching rate upon etching of the semiconductor thin film 6 is higher in the regions 6*b* than in the regions 6*a*. Thus, even if etching is performed in the regions 6*a* and the regions 6*b* under the same conditions, the film properties vary between the two different regions, causing differences in the etching rate. Consequently, only the portions of the regions 6*b* are selectively removed, and thus a semiconductor thin film 6 with a predetermined pattern, as shown in FIG. 7, can be formed. Here, sidewall portions 8 of removed etching portions 7 have a gently sloping taper shape. Note that although the results shown in FIG. 5 were obtained by hydrogen plasma treatment, even in the case of plasma treatment such as $CF_4$, differences in the etching rate were brought about.

According to the method of fabricating a thin film of the present embodiment described above, a semiconductor thin film with a predetermined pattern can be formed at low temperatures, which in turn allows a thin film to be formed easily on a flexible substrate, for example. In addition, it is not necessary to perform a lithography step conventionally required when patterning a thin film, and thus the number of fabrication steps is reduced, resulting in a reduction in costs. Moreover, since an a-Si thin film formed in the present embodiment contains few $SiH_2$ bonds, when such an a-Si thin film is applied to a thin film transistor, the thin film transistor with high mobility and high quality can be obtained. Furthermore, the a-Si thin film has few defects therein, achieving a reduction in leakage current in an OFF state.

Embodiment 2

Embodiment 2 corresponds to the case (2) described above. The present embodiment and the foregoing Embodiment 1 are the same in that both embodiments employ an energy absorber as a means for selectively heating the substrate surface. However, the present embodiment is different from the foregoing Embodiment 1 in that the substrate surface is selectively heated so that the deposition rate itself varies from region to region on the substrate, thereby forming a thin film only in specific regions.

In order that the deposition rate varies from region to region on the substrate, in the present embodiment, the substrate temperature in a region in the vicinity of the surface of an energy absorber 2 was set to about 400° C., as is shown by the solid line in FIG. 3. Here, the substrate temperature at a location, a few μm away from the energy absorber, was about 300° C. The reason for setting the temperature of the surface of the energy absorber 2 to about 400° C. is that when depositing a semiconductor thin film by low-pressure CVD using $Si_2H_6$, the temperature needs to be set to a level at which the $Si_2H_6$ is thermally decomposed (i.e., 400° C.) Thus, the above-mentioned substrate temperature is only an exemplifying value, and therefore the substrate temperature should be changed and set in accordance with materials and deposition methods for a thin film to be formed.

A semiconductor thin film is formed as follows. As is the case above, with the surface of a substrate 1 having a temperature distribution, a semiconductor thin film made of an a-Si thin film is formed on an insulating layer by low-pressure CVD. As a flux necessary for forming the semiconductor thin film, the above-mentioned $Si_2H_6$ is utilized. As for deposition conditions, as is the case above, the substrate temperature is set to 400° C., and in addition, for example, the operating pressure and gas flow rate of low-pressure CVD are set to about 300 mTorr and about 100 sccm, respectively. In the case where low-pressure CVD is not employed, it is also possible to form a semiconductor thin film by thermal CVD.

Figure 8:
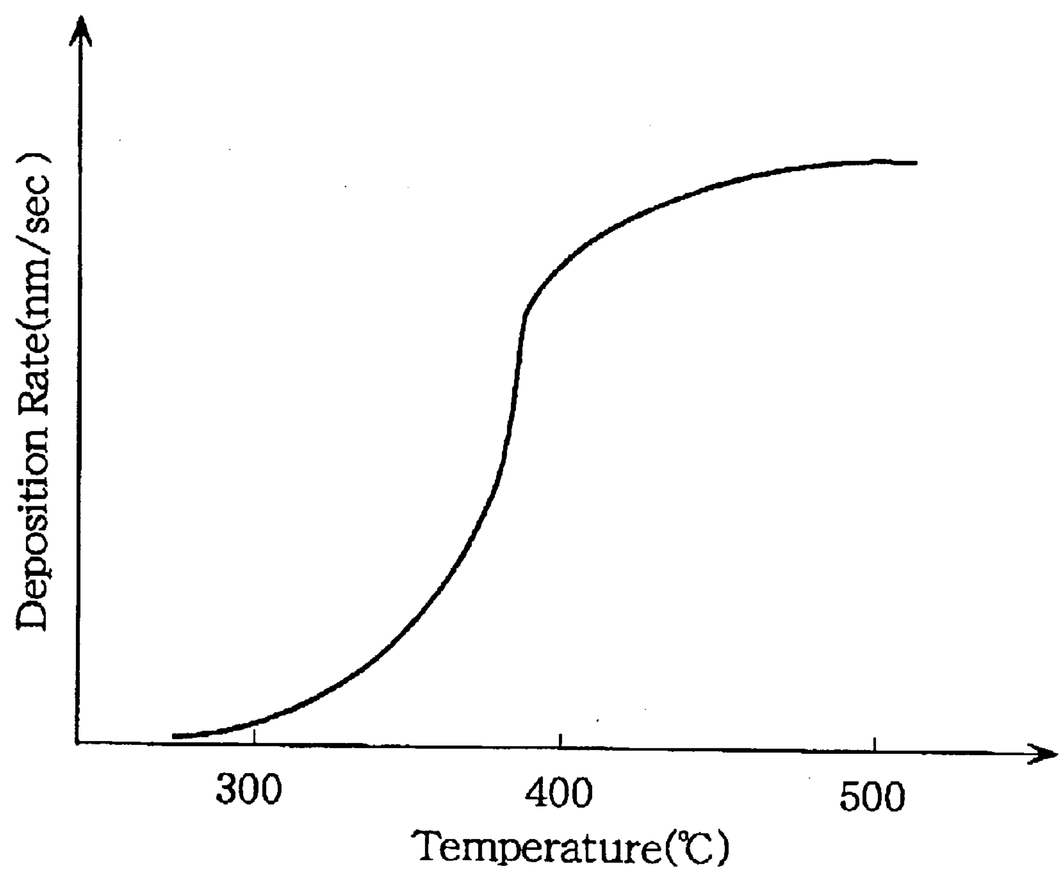
FIG. 8 is a graph showing the relationship between deposition rate and temperature on a surface of an insulating layer, in a method of fabricating a thin film according to Embodiment 2 of the present invention.

At this point, on the substrate 1, there are formed regions where the a-Si thin film is deposited and regions where the a-Si thin film is not deposited. Specifically, while the a-Si thin film is deposited in regions above and in the vicinity of energy absorbers 2, the a-Si thin film is not deposited in other regions. This can be explained, for example, by the change in deposition rate in accordance with the substrate temperature, which is shown in FIG. 8. That is, in order that the thermal decomposition of $Si_2H_6$ takes place in the formation of a film by low-pressure CVD, a temperature of, at least, about 400° C. is required. If the temperature is lower than this level, as is dear from FIG. 8, the deposition rate is rapidly reduced, and when the substrate temperature is about 300° C., it is almost impossible to deposit an a-Si thin film.

According to the method of fabricating a thin film of the present embodiment described above, a thin film with a predetermined pattern can be formed without performing a lithography step conventionally required when patterning a thin film. Consequently, the number of fabrication steps is reduced, resulting in a reduction in costs. In addition, an a-Si thin film formed in the present embodiment contains, as is the foregoing embodiment 1, few $SiH_2$ bonds, and thus when such an a-Si thin film is applied to a thin film transistor, the thin film transistor with high mobility and high quality can be obtained. Moreover, the a-Si thin film has few defects therein, achieving a reduction in leakage current in an OFF state.

Note that the present embodiment described the case where $Si_2H_6$ is used as a source gas; however, the present invention is not limited thereto. For example, it is also possible to use $SiH_4$ gas. In such a case, the surface temperature of the energy absorbers 2 needs to be set to 550° C.

Embodiment 3

A method of fabricating a thin film according to Embodiment 3 is different from a method of fabricating a thin film according to the foregoing Embodiment 1 in that a conductive film is utilized in place of an energy absorber and an electric current is passed through the conductive film to selectively heat the substrate surface.

Figure 9:
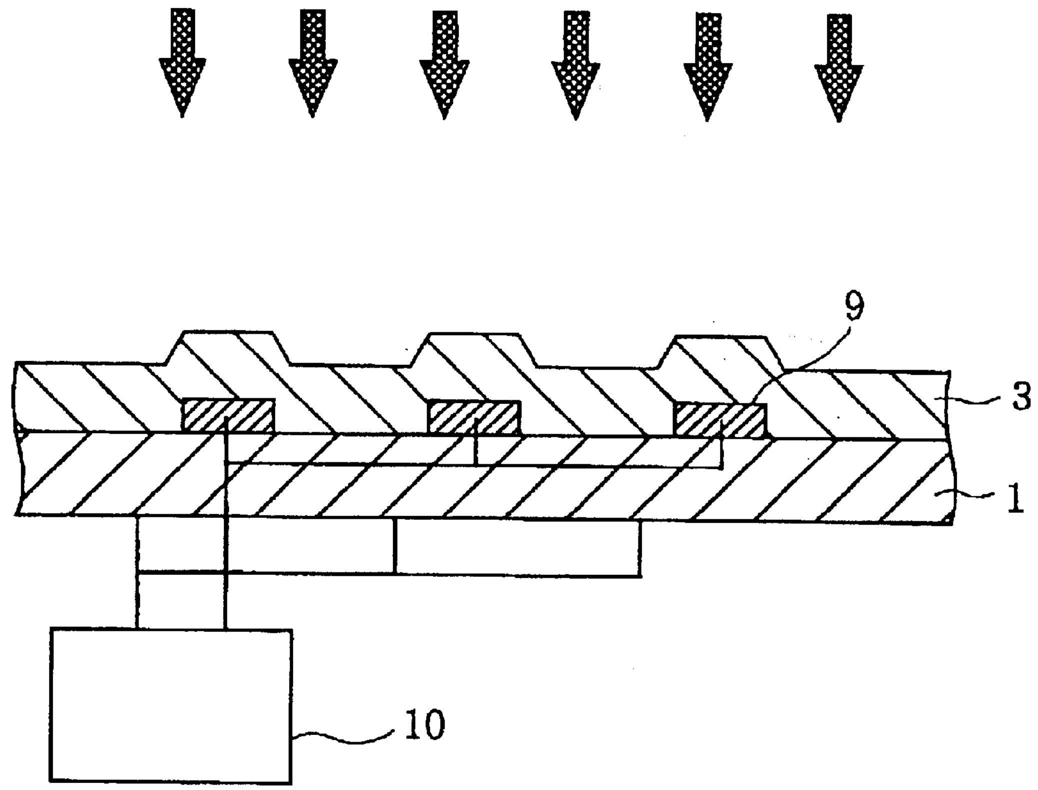
FIG. 9 is a cross-sectional view for illustrating a method of fabricating a thin film according to Embodiment 3 of the present invention.

As is shown in FIG. 9, a conductive film is formed on a substrate 1 and then pattered by any known method to form conductive films 9.

Next, on the substrate 1 provided with the conductive films 9, an insulating layer 3 of $SiO_2$, $SiN_x$, or the like is formed.

Further, as is shown in FIG. 9, with the substrate 1 being heated, a semiconductor thin film 6 made of an a-Si thin film is formed on the insulating layer 3 by, for example, plasma enhanced CVD.

Figure 10A:
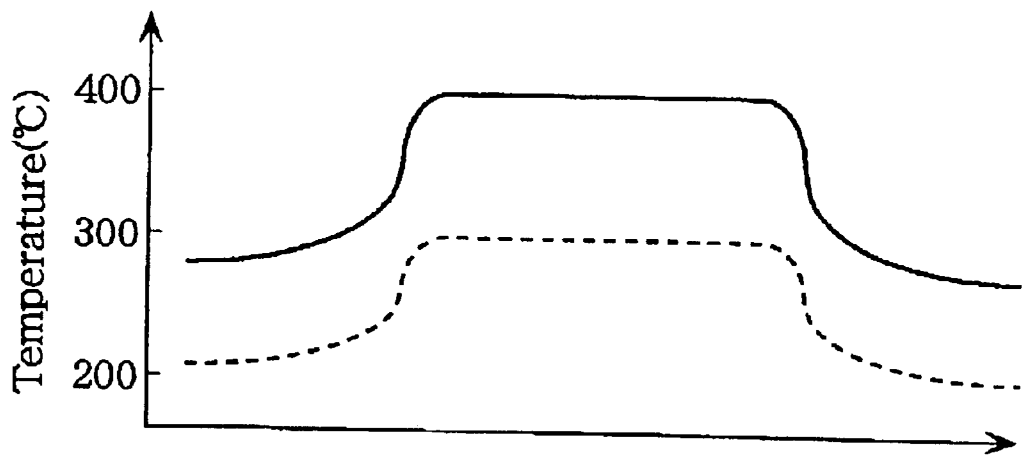
FIGS. 10(*a*) and 10(*b*) are diagrams for illustrating selective heating of a substrate, in the method of fabricating a thin film according to Embodiment 3.
Figure 10B:
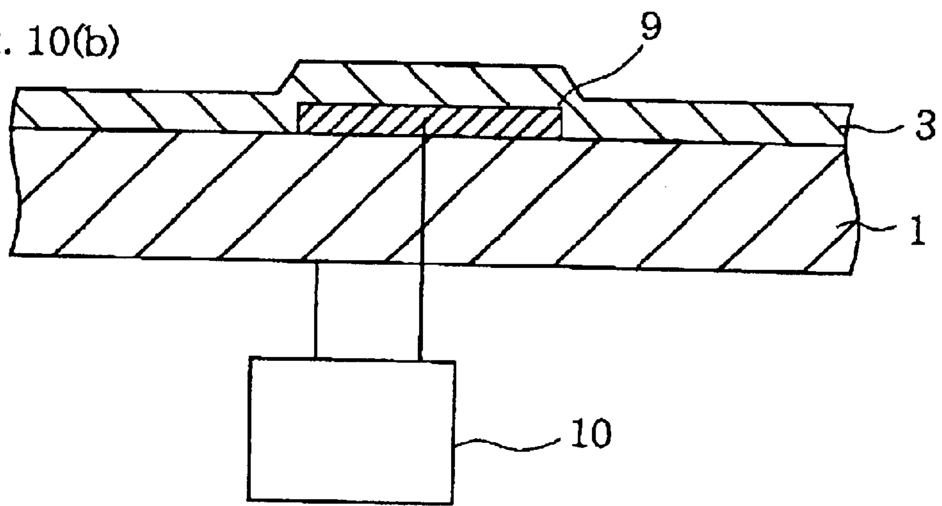

The heating of the substrate 1 is carried out as follows. Specifically, an electric current application portion 10 is connected to the conductive films 9 so as to pass an electric current through the conductive films from the electric current application portion 10. When an electric current is passed through the conductive films 9, the conductive films 9 release electrical energy as heat. Thus, regions in the vicinity of the conductive films 9 have a higher temperature than other regions where the conductive films 9 are not provided. When this state is observed as the basis for the substrate temperature, roughly, such a temperature distribution as to be shown by the dotted line in FIG. 10(*a*) is obtained. The substrate temperature in regions where the conductive films 9 are present is set, as is the foregoing Embodiment 1, to about 300° C.

Figure 11:
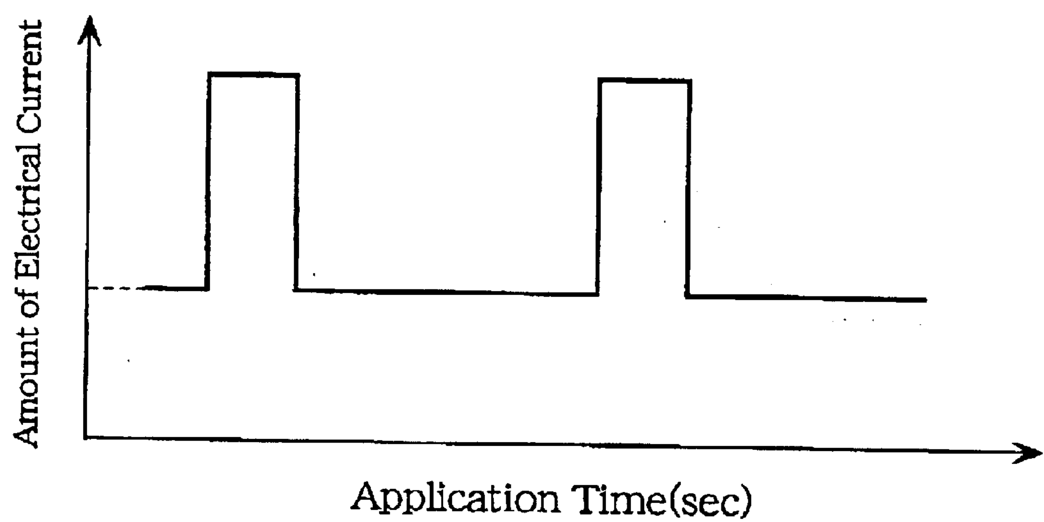
FIG. 11 is a graph showing the relationship between the amount of electrical current and application time, in the method of fabricating a thin film according to Embodiment 3.

Furthermore, the electric current to be applied to the conductive films 9 is applied preferably in a pulsed fashion (intermittently), as is shown in FIG. 11 showing the relationship between the amount of electrical current and application time (sec).

Figure 12:
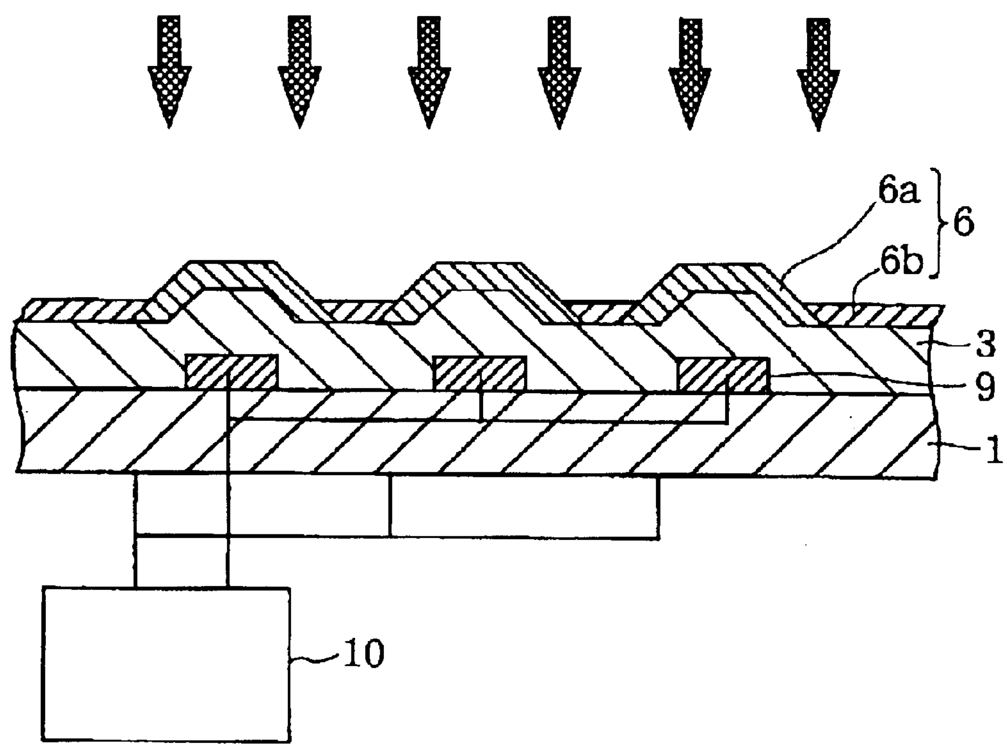
FIG. 12 is a cross-sectional view for illustrating etching of a semiconductor thin film, in the method of fabricating a thin film according to Embodiment 3.

With the surface of the substrate 1 thus having a temperature distribution, a semiconductor thin film 6 made of an a-Si thin film is formed, in the same manner as the foregoing Embodiment 1, on the insulating layer 3 by plasma enhanced CVD. Thereafter, the semiconductor thin film was etched without performing a lithography step. Consequently, as is the case with the foregoing Embodiment 1, a semiconductor thin film with a predetermined pattern can be formed at low temperatures (see FIG. 12). In addition, since it is not necessary to perform a lithography step conventionally required when patterning a thin film, the number of fabrication steps is reduced, resulting in a reduction in costs. Moreover, when an a-Si thin film formed by a method of fabricating a thin film according to the present embodiment is applied to a thin film transistor, the thin film transistor, as is the case with the foregoing Embodiment 1, which has high mobility and high quality and achieves a reduction in leakage current in an OFF state, can be obtained.

Embodiment 4

A method of fabricating a thin film according to Embodiment 4 is different from a method of fabricating a thin film according to the foregoing Embodiment 2 in that a conductive film is utilized in place of an energy absorber and an electric current is passed through the conductive film to selectively heat the substrate surface.

First, in the same manner as the foregoing Embodiment 3, a conductive film is formed on a substrate by sputtering, and then patterned by any known method to form conductive films 9.

Next, on the substrate provided with the conductive films, an insulating layer of $SiO_2$, $SiN_x$, or the like is formed.

Further,with the substrate being heated, a semiconductor thin film made of an a-Si thin film is formed on the insulating layer by, for example, plasma enhanced CVD.

The heating of the substrate is carried out as follows. Specifically, an electric current application portion is connected to the conductive films so as to pass an electric current through the conductive films. When an electric current is passed through the conductive films, the conductive films release electrical energy as heat. Thus, regions in the vicinity of the conductive films have a higher temperature than other regions where the conductive films are not provided. When this temperature distribution is observed as the basis for the substrate temperature, roughly, such a temperature distribution as to be shown by the solid line in FIG. 10(*a*) is obtained. The substrate temperature in regions where the conductive films are present is set, as is the foregoing Embodiment 1, to about 300° C.

Furthermore, the electric current to be applied to the conductive films is applied preferably in a pulsed fashion (intermittently), as is the foregoing Embodiment 3 (see FIG. 11).

With the surface of the substrate thus having a temperature distribution, a semiconductor thin film made of an a-Si thin film is formed, in the same manner as the foregoing Embodiment 2, on the insulating layer by low-pressure CVD. Consequently, as is the case with the foregoing Embodiment 2, the a-Si thin film is deposited only in regions above and in the vicinity of the conductive films, and thus a semiconductor thin film with a predetermined pattern was formed.

As described above, according to a method of fabricating a thin film of the present embodiment, it is not necessary to perform a lithography step conventionally required when patterning a thin film, and thus the number of fabrication steps is reduced, resulting in a reduction in costs. Moreover, when an a-Si thin film formed by a method of fabricating a thin film according to the present embodiment is applied to a thin film transistor, the thin film transistor, as is the case with the foregoing Embodiment 1, which has high mobility and high quality and achieves a reduction in leakage current in an OFF state, can be obtained.

Embodiment 5

Figure 13A:
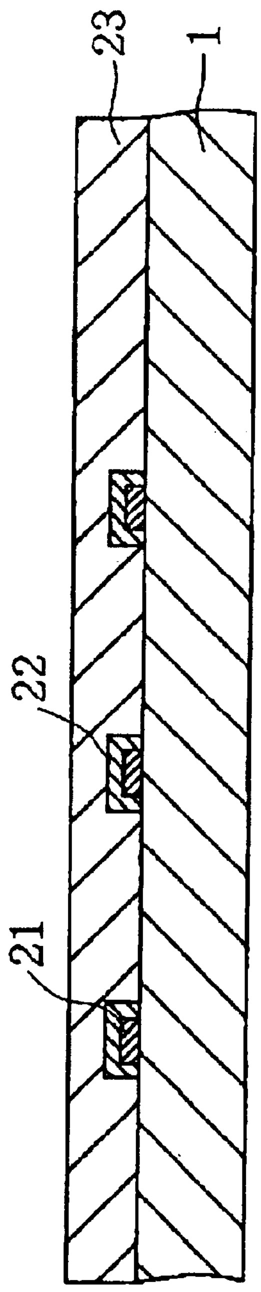
FIGS. 13(*a*) and 13(*b*) are cross-sectional views showing the fabrication steps of a semiconductor thin film according to Embodiment 5 of the present invention.
Figure 13B:
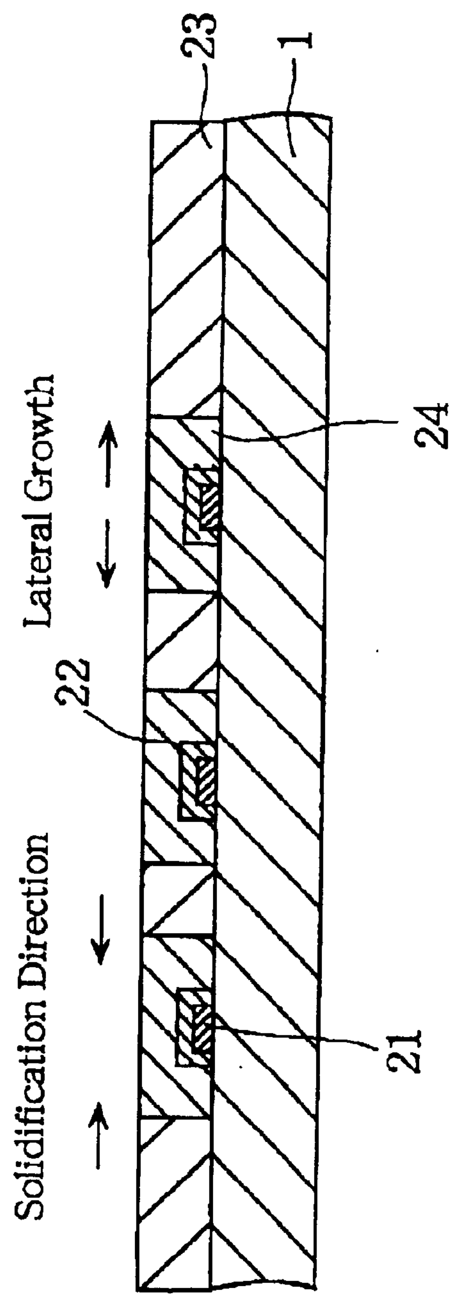

Embodiment 5 of the present invention is described below. FIGS. 13(*a*) and 13(*b*) are cross-sectional views showing the fabrication steps of a semiconductor thin film according to the present embodiment.

First, on a substrate 1, a precursor film of energy absorbers 21 is formed by sputtering or the like, and then the film is patterned in a predetermined pattern to form the energy absorbers 21. The energy absorbers 21 have basically the same function as energy absorbers described in the foregoing Embodiment 1. In addition, the energy absorbers 21 according to the present embodiment are made, for example, of any one type of metal selected from the group consisting of Ni, Pd, Pt, Ag, and Al, or of an alloy containing two or more types of metal selected from the same group.

A pattern is not particularly limited, and thus it is possible to form a plurality of the energy absorbers 21 in, for example, a dot or stripe pattern with an arbitrary space therebetween. In addition, for a patterning method, photolithography, for example, can be employed.

Next, after the energy absorbers 21 have been patterned, light is irradiated intermittently onto the entire surface of the substrate 1 from the other side of the deposited surface of the substrate 1, so as to heat the substrate such that the substrate temperature in regions in the vicinity of the surfaces of the energy absorbers 21 is about 400° C. In this state, first semiconductor thin films 22 are formed by low-pressure CVD. At this point, the surfaces of the energy absorbers 2 have a higher temperature than regions on the substrate 1 where the energy absorbers 21 are not provided. Thus, the surfaces of the energy absorbers 21 have a higher deposition rate than regions on the substrate where the energy absorbers are not provided, making it possible to form the first semiconductor thin films 22 only on the surfaces of the energy absorbers 21. Here, examples of the first semiconductor thin film 22 include an a-Ge film and an a-SiGe film. In addition, examples of a flux used in thermal CVD for forming such films include $GeH_4$ gas and $Si_2H_6$ gas. Furthermore, the film thickness of the first semiconductor thin film 22 should be in the range from about 10 to 50 nm.

Subsequently, on the substrate 1 and on the first semiconductor thin films 22, a second semiconductor thin film 23 made, for example, of an a-Si thin film is formed. The second semiconductor thin film 23 can be deposited by, for example, plasma enhanced CVD or low-pressure CVD. Moreover, the film thickness of the second semiconductor thin film 23 should be in the range from about 30 to 100 nm.

Next, as is shown in FIG. 13(*b*), the second semiconductor thin film 23 is heat treated and crystallized. The crystallization first begins at the first semiconductor thin films 22 as the initial growth nucleus. Further, by the effect that the first semiconductor thin films 22 are the starting point of solid phase growth, crystal growth in the lateral direction (lateral growth) occurs. Thereby, single crystal regions 24 with a grain size of about 2 to 3 μm are created in the vicinity of the first semiconductor thin films 22 being the center of the regions. Regions other than the single crystal regions 24 remain in an amorphous state. The first semiconductor thin films 22 become the initial growth nucleus because the first semiconductor thin films 22 have a lower melting point than the second semiconductor thin film 23. In addition, the energy absorbers 21 serve as a catalyst for reducing the potential barrier so as to crystallize the second semiconductor thin film 23. Here, the second semiconductor thin film 23 is a semiconductor thin film preferably with a higher melting point than the first semiconductor thin films 22. This is because when crystallizing the second semiconductor thin film 23, by allowing crystallization to first begin at the first semiconductor thin films 22 with a low melting point, the first semiconductor thin films 22 can function as the initial growth nucleus. Further, the second semiconductor thin film 23 is preferably made of a material different from a material for the first semiconductor thin films 22. This is because when a metal film made of the above-described metal is utilized for the energy absorbers 21, diffusion of the above-described metal into the second semiconductor thin film 23 caused by heat treatment performed for crystallizing the second semiconductor thin film 23 can be prevented. Moreover, in view of the prevention of diffusion, it is preferable that a film made of an alloy be used for the energy absorbers 21. Note that for heat treatment conditions, for example, the treatment temperature can be set to 550 to 600° C. and the treatment time can be set to 3 hours or more.

The second semiconductor thin film 23 can also be crystallized by intermittently irradiating excimer laser to the energy absorbers 21 and regions in the vicinity of the energy absorbers 21, instead of performing the above-described heat treatment. In this case, the irradiated first semiconductor thin films 22 melt to the liquid phase once, and as liquid-phase regions expand around the semiconductor thin films in the lateral direction, crystallization proceeds. Thereby, the single crystal regions 24 are formed in which the crystals have been grown to about 4 to 5 μm in size. In the cooling process after irradiation, solidification proceeds within the range of laser shot irradiation (i.e., the single crystal regions 24), from the outer to the inner.

The single crystal region 24 thus obtained is a very high performance thin film. When the single crystal region 24 is applied, for example, to the channel portion of a TFT, the TFT with high mobility can be obtained. Such a TFT can be applied not only to an active matrix liquid crystal display capable of realizing a high definition display, but also to a built-in drive circuit in which high-speed operation is demanded. In addition, such a TFT can be applied to an organic EL device in which a TFT for current drive is required in the pixel portion Note that the present embodiment described an example that applied a method of fabricating a thin film according to the foregoing Embodiment 2; however, the present invention is not limited thereto. It is also possible to apply a method of fabricating a thin film according to the foregoing Embodiment 2.

Embodiment 6

Embodiment 6 of the present invention is described below.

Figure 14A:
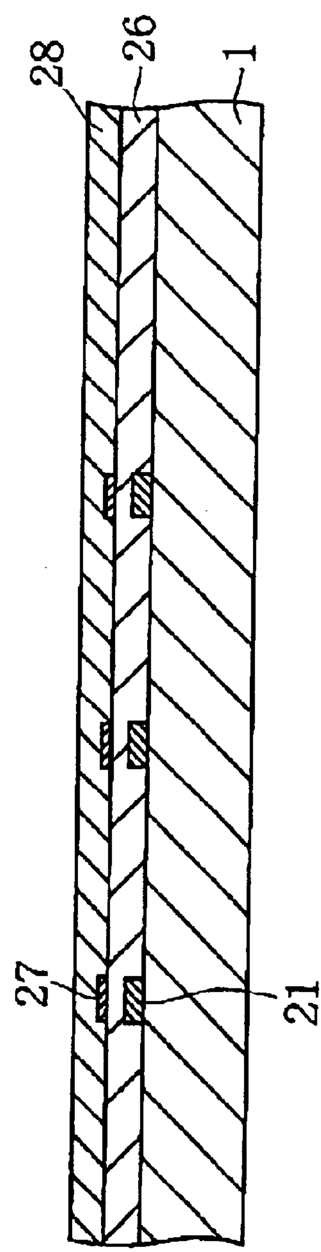
FIGS. 14(*a*) and 14(*b*) are cross-sectional views showing the fabrication steps of a semiconductor thin film according to Embodiment 6 of the present invention.
Figure 14B:
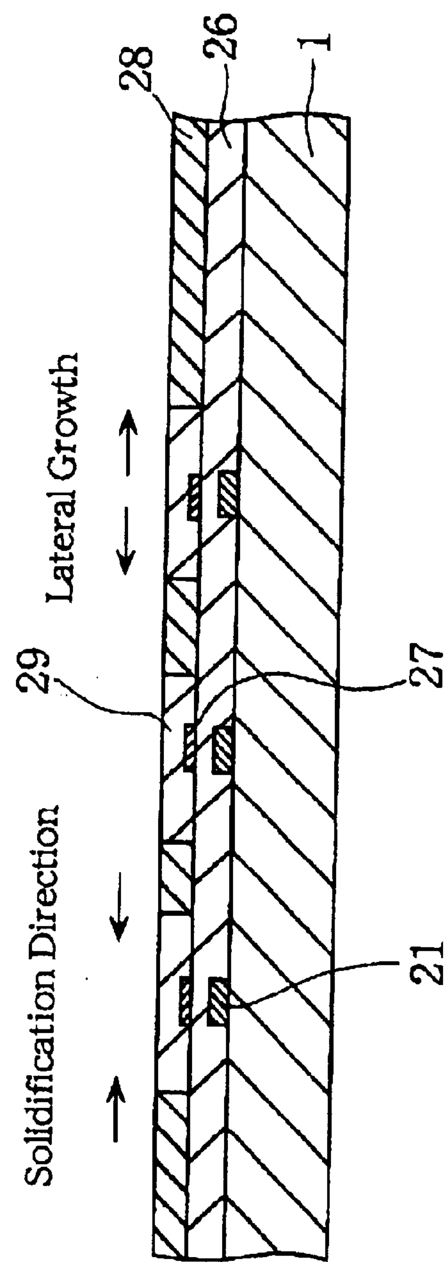

FIGS. 14(*a*) and 14(*b*) are cross-sectional views showing the fabrication steps of a semiconductor thin film according to the present embodiment.

First, in the same manner as the foregoing Embodiment 5, on a substrate 1, energy absorbers 21 with a predetermined pattern are formed. Then, an insulating layer 26 is formed by plasma enhanced CVD.

Subsequently, light is irradiated intermittently onto the entire surface of the substrate 1 from the other side of the deposited surface of the substrate 1 to heat the substrate such that the substrate temperature in regions in the vicinity of the surfaces of the energy absorbers 21 is about 400° C. In this state, first semiconductor thin films 22 are formed by low-pressure CVD. At this point, regions above and in the vicinity of the energy absorbers 21 in the insulating layer 26 have a higher temperature than other regions. Thus, the first semiconductor thin films 27 are formed only on the surfaces of the energy absorbers 21. Here, examples of the first semiconductor thin film 27 include an a-Ge film and an a-SiGe film. In addition, examples of a flux used in thermal CVD for forming such films include $GeH_4$ gas and $Si_2H_6$ gas. Furthermore, the film thickness of the first semiconductor thin film 27 should be in the range from about 10 to 50 nm.

Subsequently, on the substrate 1 and the first semiconductor thin films 27, a second semiconductor thin film 28 made, for example, of an a-Si thin film is formed. The second semiconductor thin film 28 can be deposited by, for example, plasma enhanced CVD or low-pressure CVD. Moreover, the film thickness of the second semiconductor thin film 28 should be in the range from about 30 to 100 nm.

Moreover, as is shown in FIG. 14(*b*), the second semiconductor thin film 28 is irradiated with excimer laser 25 and crystallized. The crystallization begins, as is the foregoing Embodiment 5, at the first semiconductor thin films 27 as the initial growth nucleus, and lateral growth occurs on the first semiconductor thin films 27 as the starting point of solid phase growth. Further, in the cooling process after irradiation, solidification proceeds within the range of laser shot irradiation (i.e., the single crystal regions 29), from the outer to the inner. As a result, as is the foregoing Embodiment 5, single crystal regions 29 with a grain size of about 4 to 5 μm can be formed in the second semiconductor thin film 28. Note that regions other than the single crystal regions 29 remain in an amorphous state.

The single crystal region 29 thus obtained is a very high performance thin film. When such a region is applied, for example, to the channel portion of a TFT, the TFT with high mobility can be obtained. Hence, it is possible to provide a TFT applicable to an active matrix liquid crystal display capable of realizing a high definition display and a TFT suitable for built-in drive circuit in which high-speed operation is demanded. In addition, such a TFT can be applied to an organic EL device in which a TFT for current drive is required in the pixel portion.

Note that the present embodiment described an example that applied a method of fabricating a thin film according to the foregoing Embodiment 2; however, the present invention is not limited thereto. It is also possible to apply a method of fabricating a thin film according to the foregoing Embodiment 2.

The present invention is described in more detail below with reference to the examples; however, the present invention is not limited thereto.

EXAMPLE 1

Figure 15:
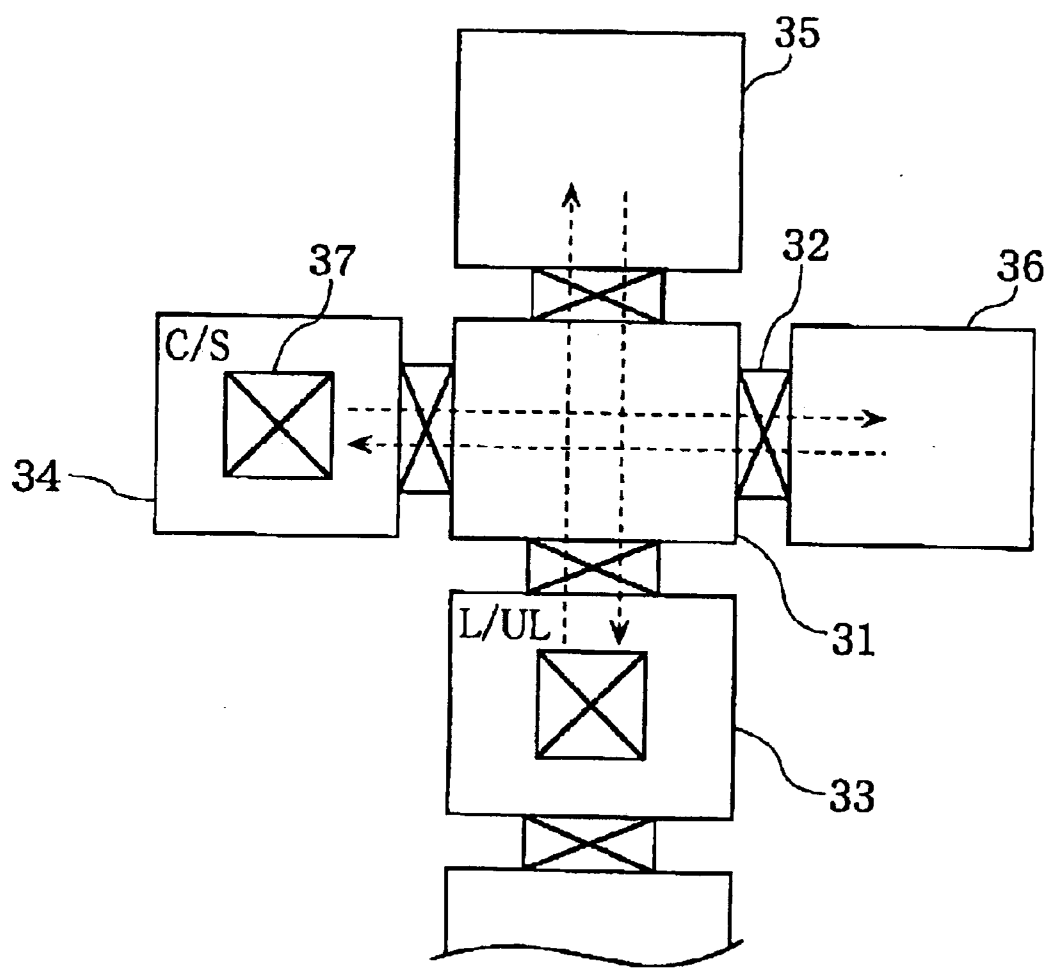
FIG. 15 is a plan view schematically showing an apparatus for fabricating a thin film transistor used in Example 1 of the present invention.
Figure 16:
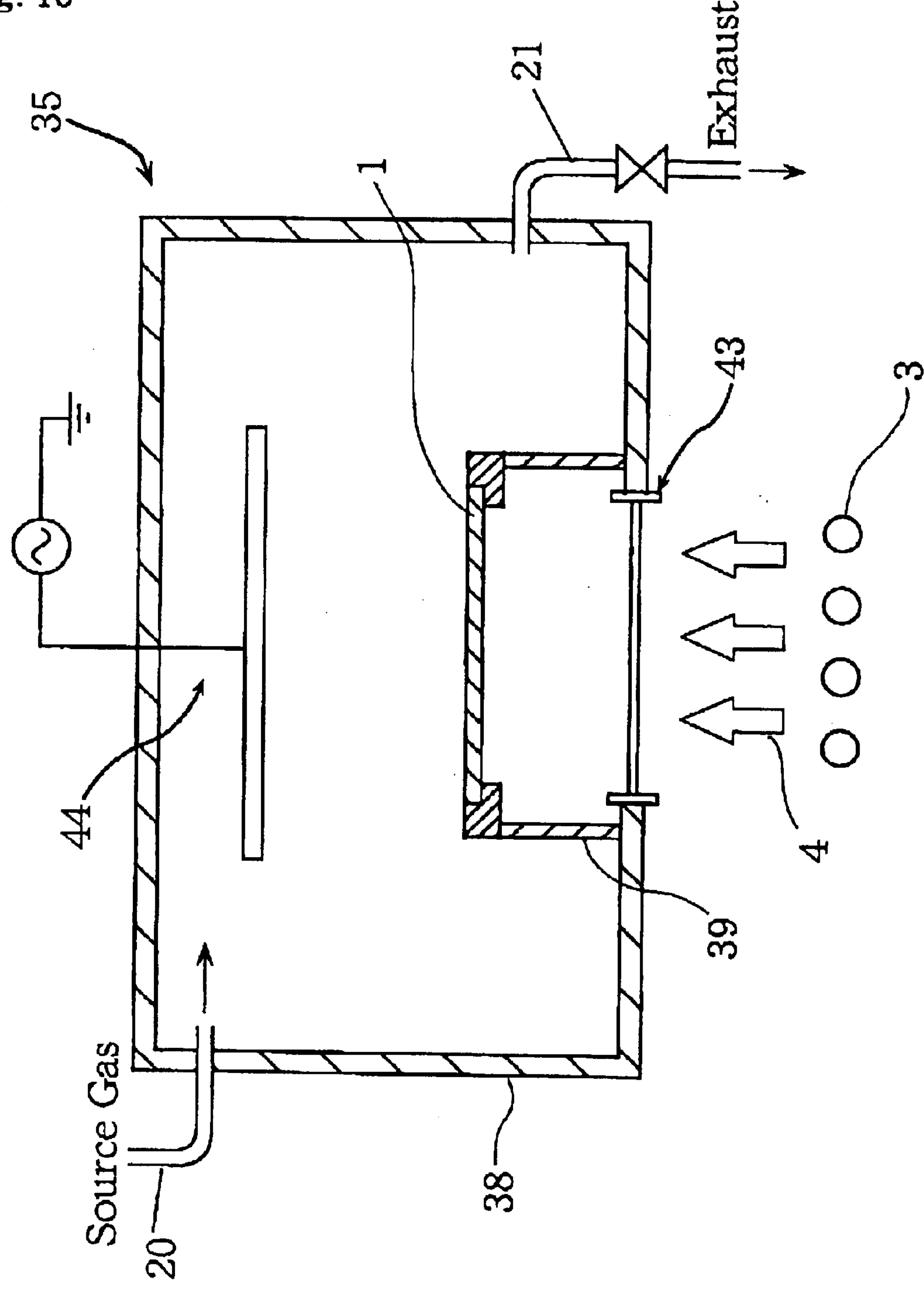
FIG. 16 is a cross-sectional view schematically showing a plasma enhanced CVD system used in Example 1 of the present invention.
Figure 17A:
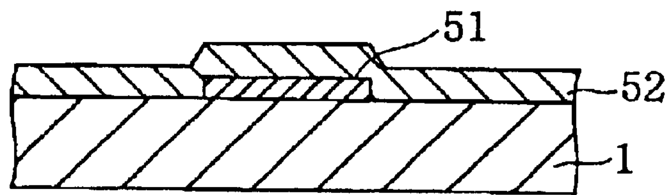
FIGS. 17(*a*) to 17(*e*) are cross-sectional views for illustrating the fabrication steps of a thin film transistor according to Example 1 of the present invention.
Figure 17B:
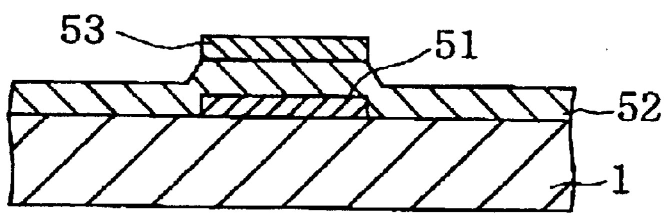
Figure 17C:
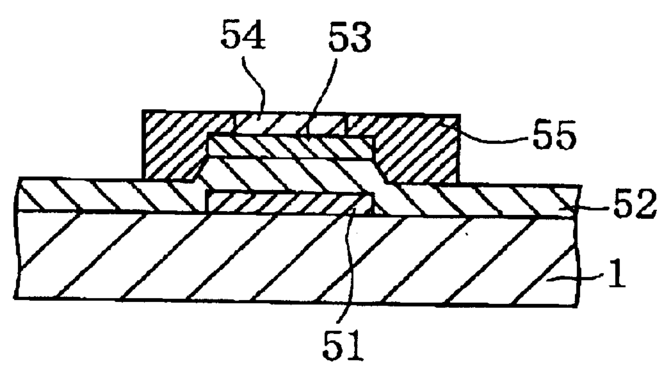
Figure 17D:
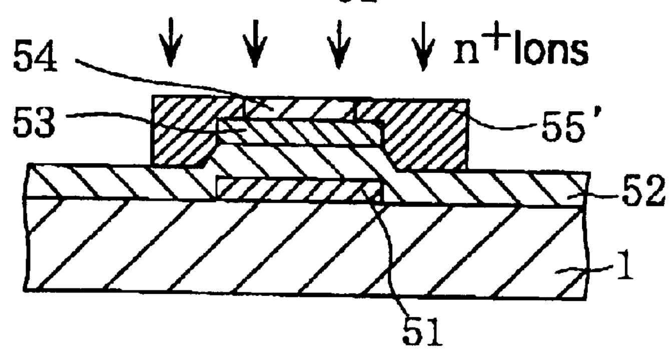
Figure 17E:
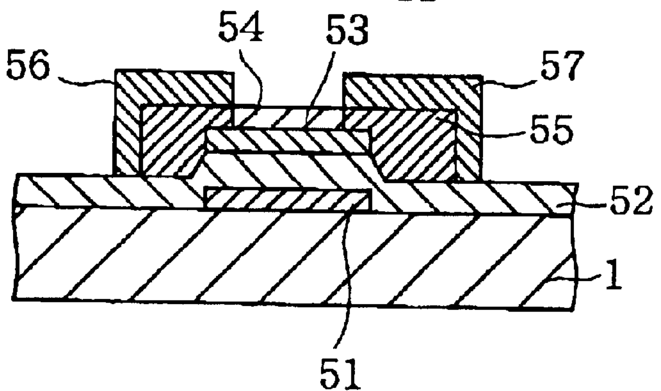

Example 1 is such that a method of fabricating a thin film according to the foregoing Embodiment 1 is applied to the fabrication of a thin film transistor. FIG. 15 is a plan view schematically showing an apparatus for fabricating a thin film transistor used in Example 1. FIG. 16 is a cross-sectional view schematically showing a plasma enhanced CVD system used in Example 1. FIGS. 17(*a*) to 17(*e*) are cross-sectional views for illustrating the fabrication steps of a thin film transistor according to Example 1.

First, an apparatus for fabricating a thin film transistor used in Example 1 is described. This fabrication apparatus has, as shown in FIG. 15, a multi-chamber configuration in which around a plasma enhanced CVD chamber (thin film formation means) 31, a load and unload (L/UL) chamber 33, a cassette station (C/S) 34, a sputtering chamber 35, and an etching chamber (etching means) 36 are provided, each being connected to the plasma enhanced CVD chamber 31 via a gate valve 32.

In the plasma enhanced CVD chamber 31, a thin film is formed on a substrate 1 by plasma enhanced CVD. More specifically, as shown in FIG. 16, the plasma enhanced CVD chamber 31 includes a reaction chamber (reaction vessel) 38, a holder 39 for holding the substrate 1, a gas supply tube (supply portion) 40 for supplying a source gas to the inside of the reaction chamber 38, an exhaust tube 41 for exhausting gas from the reaction chamber 38, a halogen lamp (electromagnetic wave irradiation portion) 42 provided outside the reaction chamber 38, a viewport 43 for transmitting light generated from the halogen lamp 42, an upper electrode 44, and a lower electrode (reaction excitation portion). The viewport 43 is made, for example, of quartz or glass.

The L/UL chamber 33 transfers the substrate 1 in and out from the outside via the gate valve 32. The cassette station 34 stores a cassette. The cassette stores a plurality of the substrates 1. In the sputtering chamber 35, a thin film is formed on the substrate 1 by sputtering. In the etching chamber 36, the thin film formed on the substrate 1 is removed. The substrate 1 is transferred in and out between the chambers by a substrate transport means 37 such as a robot.

Using an apparatus for fabricating a thin film transistor having an apparatus configuration such as that described above, a thin film transistor according to Example 1 was fabricated as follows.

First, a substrate 1 made of a glass substrate was transported to the sputtering chamber 35 by the substrate transport means 37. In the sputtering chamber 35, a metal film made of Mo was coated on the substrate 1 by sputtering. Thereafter, the metal film was patterned in a predetermined pattern by photolithography to form a gate electrode 51. Subsequently, the substrate 1 having formed thereon the gate electrode 51 was transported to the plasma enhanced CVD chamber 31 by the substrate transport means 37, and a gate insulating layer 52 made of $SiN_x$ was formed on the substrate 1 by plasma enhanced CVD (see FIG. 17(*a*)).

Then, using the halogen lamp 42, light was irradiated intermittently onto the substrate 1 from the other side of the deposited surface. Here, the surface temperature of the gate insulating layer 52 in a region above the gate electrode 51 was set to about 300° C. In addition, using $SiH_4$ gas as a source gas, an a-Si thin film was formed on the gate insulating layer 52 by plasma enhanced CVD. In the a-Si thin film thus formed, portions above and in the vicinity of the gate electrode 51 had such film properties that contain few $SiH_2$ bonds, while other portions had such film properties that contain numerous $SiH_2$ bonds.

Moreover, the substrate 1 was transported to the etching chamber 36 and the a-Si thin film was etched by hydrogen plasma treatment so as to selectively remove the portions with such film properties that contain numerous $SiH_2$ bonds. Thereby, as is shown in FIG. 17(*b*), a semiconductor thin film 53 with a predetermined pattern was formed.

Next, on the gate insulating layer 52 and the semiconductor thin film 53, a $SiN_x$ film was formed by plasma enhanced CVD and then patterned by photolithography to form a channel passivation layer 54.

Subsequently, on the gate insulating layer 52, the semiconductor thin film 53, and the channel passivation layer 54, an a-Si thin film 55 was formed by plasma enhanced CVD and then patterned by photolithography (see FIG. 17(*c*)). Further, $n^+$ ions were implanted from the top of the channel passivation layer 54, thereby forming an $n^+$ a-Si thin film 55' (see FIG. 17(*d*)).

Then, a metal film made of Mo was coated by sputtering and then patterned in a predetermined pattern by photolithography to form a source electrode 56 and a drain electrode 57 (see FIG. 17(*e*)).

Thus, a channel passivation type thin film transistor according to Example 1 was fabricated.

EXAMPLE 2

Figure 18A:
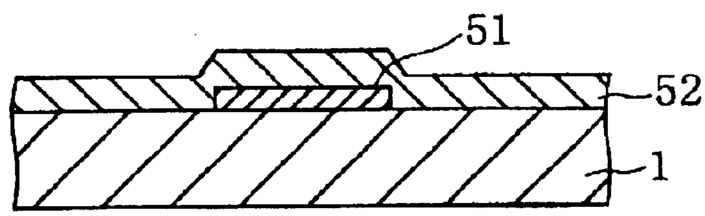
FIGS. 18(*a*) to 18(*c*) are cross-sectional views for illustrating the fabrication steps of a thin film transistor according to Example 2 of the present invention.
Figure 18B:
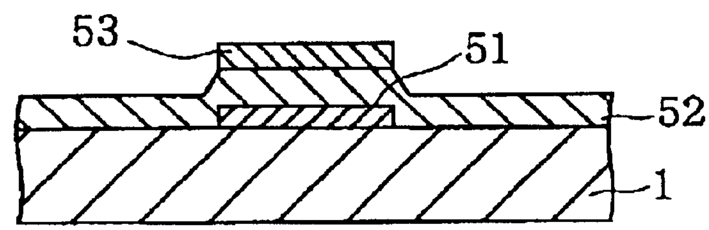
Figure 18C:
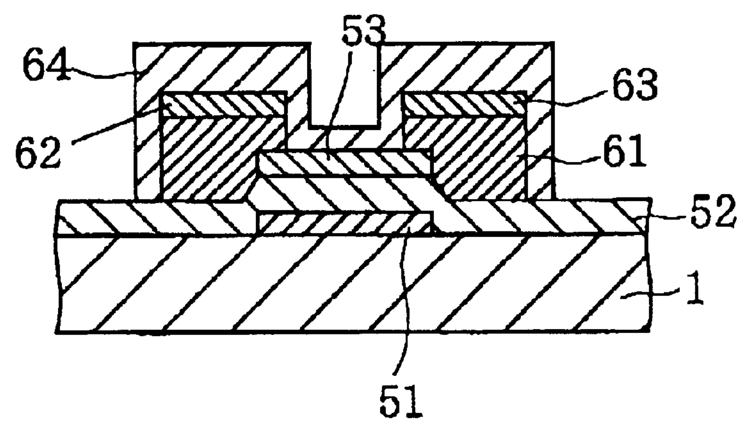
Figure 19A:
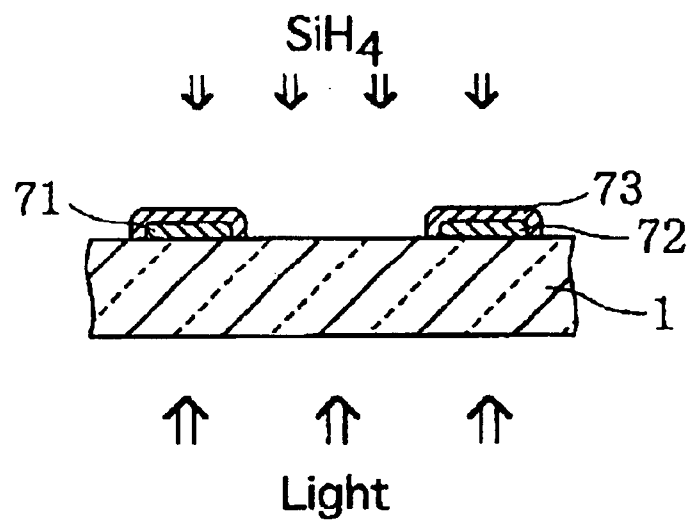
FIGS. 19(*a*) to 19(*d*) are cross-sectional views for illustrating the fabrication steps of a thin film transistor according to Example 9 of the present invention.
Figure 19B:
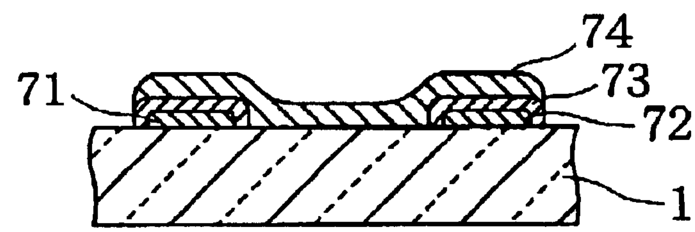
Figure 19C:
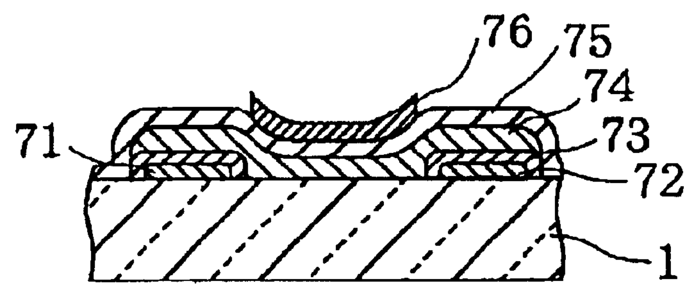
Figure 19D:
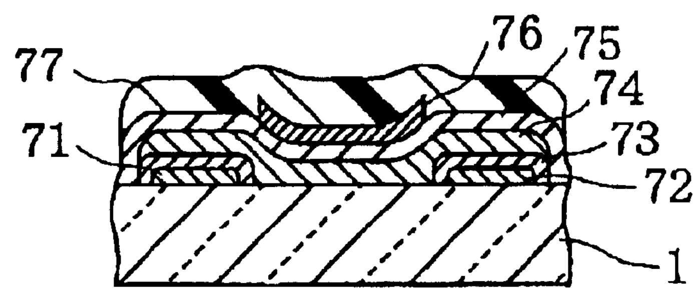

Example 2 is such that a method of fabricating a thin film according to the foregoing Embodiment 1 is applied to the fabrication of a thin film transistor. Note that a thin film transistor according to Example 2 is different from a thin film transistor according to the foregoing Example 1 in that the thin film transistor is of a channel etch type. FIGS. 18(*a*) to 18(*c*) are cross-sectional views for illustrating the fabrication steps of a thin film transistor according to the present example.

First, in the same manner as the foregoing Example 1, a gate electrode 51 was formed, and then further a gate insulating layer 52 made of $SiN_x$ was formed (see FIG. 18(*a*)).

Next, in the same manner as the foregoing Example 1, on the gate insulating layer 52, an a-Si thin film was formed and then etched by hydrogen plasma treatment to form a semiconductor thin film 53 (see FIG. 18(*b*)).

Then, on the gate insulating layer 52 and the semiconductor thin film 53, an a-Si thin film was formed by plasma enhanced CVD, and thereafter, $n^+$ ions were implanted from the top of the a-Si thin film, thereby forming an $n^+$ a-Si thin film. Further, on the $n^+$ a-Si thin film, a metal film made of a Ti—Al layered film was formed. Subsequently, the $n^+$ a-Si thin film and the metal film were patterned, by photolithography, in a predetermined pattern so as to form an $n^+$ a-Si thin film 61, a source electrode 62, and a drain electrode 63.

Moreover, a $SiN_x$ layer was formed to cover the semiconductor thin film 53, the $n^+$ a-Si thin film 61, the source electrode 62, and the drain electrode 63, and then patterned by photolithography to form a passivation layer 64.

Thus, a channel etch type thin film transistor according to Example 2 was fabricated.

EXAMPLE 3

Example 3 is such that a method of fabricating a thin film according to the foregoing Embodiment 2 is applied to the fabrication of a thin film transistor.

First, in the same manner as the foregoing Example 1, a gate electrode 51 was formed, and then further a gate insulating layer 52 made of $SiN_x$ was formed (see FIG. 17(*a*)).

Next, in the same manner as the foregoing Example 1, using a halogen lamp, light was irradiated intermittently onto the substrate 1 from the other side of the deposited surface. Here, the surface temperature of the gate insulating layer 52 in a region above the gate electrode 51 was set to about 400° C. Subsequently, using $Si_2H_6$ gas as a source gas, an a-Si thin film was deposited, by low-pressure CVD, only in regions of the gate insulating layer 52 above and in the vicinity of the gate electrode 51 (see FIG. 17(*b*)).

Then, in the same manner as the foregoing Example 1, a channel passivation layer 54, an $n^+$ a-Si thin film 55', a source electrode 56, and a drain electrode 57 were formed (see FIG. 17(*e*)).

Thus, a channel passivation type thin film transistor according to Example 3 was fabricated.

EXAMPLE 4

Example 4 is such that a method of fabricating a thin film according to the foregoing Embodiment 2 is applied to the fabrication of a thin film transistor. Note that a thin film transistor according to Example 4 is different from a thin film transistor according to the foregoing Example 3 in that the thin film transistor is of a channel etch type.

First, in the same manner as the foregoing Example 2, a gate electrode 51 was formed, and then further a gate insulating layer 52 made of $SiN_x$ was formed (see FIG. 18(*a*)).

Next, in the same manner as the foregoing Example 1, using a halogen lamp, light was irradiated intermittently onto the substrate 1 from the other side of the deposited surface. Here, the surface temperature of the gate insulating layer 52 in a region above the gate electrode 51 was set to about 400° C. Subsequently, using $Si_2H_6$ gas as a source gas, an a-Si thin film was deposited, by low-pressure CVD, only in regions of the gate insulating layer 52 above and in the vicinity of the gate electrode 51 (see FIG. 18(*b*)).

Subsequently, in the same manner as the foregoing Example 2, on the gate insulating layer 52 and the semiconductor thin film 53, an $n^+$ a-Si thin film was formed, and then on the $n^+$ a-Si thin film a metal film made of a Ti—Al layered film was formed. Further, the $n^+$ a-Si thin film and the metal film were patterned in a predetermined pattern by photolithography so as to form an $n^+$ a-Si thin film 61, a source electrode 62, and a drain electrode 63. Moreover, a passivation layer 64 was formed to cover the semiconductor thin film 53, the $n^+$ a-Si thin film 61, the source electrode 62, and the drain electrode 63.

Thus, a channel etch type thin film transistor according to Example 4 was fabricated.

EXAMPLES 5 TO 8

Thin film transistors according to Examples 5 to 8 correspond to thin film transistors according to the foregoing Examples 1 to 4, respectively, and have the same configurations as their corresponding thin film transistors. Note, however, that the fabrication methods for the thin film transistors according to Examples 5 to 8 are different from those for the thin film transistors according to Examples 1 to 4 in that the substrate surface was selectively heated by passing an electric current through the gate electrodes, instead of irradiating light.

EXAMPLE 9

Example 9 is such that a method of fabricating a thin film according to the foregoing Embodiment 1 is applied to the fabrication of a thin film transistor. Note that a thin film transistor according to Example 9 is different from a thin film transistor according to the foregoing Example 1 in that the thin film transistor is of a top-gate type. FIGS. 19(*a*) to 19(*d*) are cross-sectional views for illustrating the fabrication steps of a thin film transistor according to Example 9.

First, as is shown in FIG. 19(*a*), a metal film made of Mo was deposited on a substrate 1 by sputtering. This metal film was patterned by photolithography to form a source electrode 71 and a drain electrode 72.

Next, using a halogen lamp, light was irradiated intermittently onto the substrate 1 from the other side of the deposited surface. Here, the surface temperatures of the source electrode 71 and the drain electrode 72 were set to about 300° C. Further, using $SiH_4$ gas as a source gas, an a-Si thin film was formed, by plasma enhanced CVD, on the substrate 1, the source electrode 71, and the drain electrode 72. In the a-Si thin film thus formed, portions covering the source electrode 71 and the drain electrode 72 had such film properties that contain few $SiH_2$ bonds and other portions had such film properties that contain numerous $SiH_2$ bonds. Moreover, $n^+$ ions were implanted in the a-Si thin film, thereby forming an $n^+$ a-Si thin film.

Subsequently, the $n^+$ a-Si thin film was etched by hydrogen plasma treatment so as to selectively remove only the portions with such film properties that contain numerous $SiH_2$ bonds. Thereby, an $n^+$ a-Si thin film 73 with a predetermined pattern was formed.

Then, on the substrate 1 and the $n^+$ a-Si thin film 73, an a-Si thin film was formed and then patterned, by photolithography, into an island so as to have a predetermined pattern, thereby forming an a-Si thin film 74 (see FIG. 19(*b*)).

Subsequently, on the substrate 1 and the a-Si thin film 74, a gate insulating layer 75 made of $SiO_2$ was formed by plasma enhanced CVD Further, a metal film was formed on the gate insulating layer 75 and then patterned, by photolithography, in a predetermined pattern to form a gate electrode 76 (see FIG. 19(*c*)). Note that in the case where the source electrode 71 and the drain electrode 72 are self-aligned with the gate 15 electrode 76, the gate electrode 76 is formed preferably by backside exposure such that the substrate 1 is irradiated with light from the other side of the deposited surface, and by lift-off.

Finally, a passivation film 77 made of a $SiN_x$ film was formed by plasma enhanced CVD (see FIG. 19(*d*)).

Thus, a top-gate type thin film transistor according to Example 9 was fabricated.

(Results)

According to the methods of fabricating a thin film transistor of Examples 1 to 9 described above, when forming a semiconductor thin film 53 with a predetermined pattern, no mask was required and thus the number of masks was reduced, achieving a reduction in fabrication costs. In addition, in the foregoing Example 3 and 4, it was not necessary to etch an a-Si thin film by hydrogen plasma treatment, and therefore the number of fabrication steps was further reduced compared to the foregoing Examples 1 and 2.

Moreover, thin film transistors obtained in the foregoing Examples 1 to 9 had an a-Si thin film containing therein few $SiH_2$ bonds, and thus the thin film transistors had high mobility and high quality. Further, the a-Si thin film had few defects therein, and therefore a reduction in leakage current in an OFF state was made possible.

(Miscellaneous)

Note that when a semiconductor thin film formed in a predetermined pattern in the foregoing Examples 1 and 2 was crystallized using excimer laser or the like, it was also possible to fabricate a polycrystalline silicon thin film transistor intended to realize an on-glass structure such as drive-circuit-on-glass. In this case too, the number of masks was reduced, and thus a reduction in fabrication costs was achieved.

Furthermore, the foregoing Example 9 described the case of forming an a-Si thin film; however, the present invention is not limited thereto. It is also possible to form a p-Si film.

INDUSTRIAL APPLICABILITY

As has been described above, according to the methods of the present invention, when forming a thin film, the entire surface of the substrate is not heated but only a portion of the substrate necessary for film formation is selectively heated, and thus a significant increase in substrate temperature can be prevented, reducing the process temperature.

In addition, since a thin film is formed with the substrate being selectively heated, a film with film properties varying from region to region is formed on the substrate. By varying the film properties, differing etching rates can be obtained, and thus even if etching is performed under the same conditions, only portions with specified film properties can be selectively removed. As a result, the processing steps such as photolithography conventionally required can be reduced, making it possible to reduce the number of fabrication steps and fabrication costs.

Moreover, when a thin film is formed with the substrate being selectively heated, differing deposition rates can be obtained, and thus it is possible to deposit a thin film only in a specified region on the substrate. Thus, in this case too, a lithography step conventionally required when patterning a thin film can be omitted, and therefore the number of fabrication steps is reduced, achieving a reduction in costs.

Furthermore, semiconductor thin films fabricated according to the methods of the present invention have high mobility. Thus, when, for example, a thin film transistor provided with such a semiconductor thin film is applied to a liquid crystal display device and the like, a high-definition device and a high-speed built-in drive circuit can be obtained. In addition, since the above-described semiconductor thin films have few defects, a reduction in leakage current in an OFF state is achieved. Thus, thin film transistors provided with such semiconductor thin films according to the present invention have excellent performance and excellent reliability.

What is claimed is:

1. A method of fabricating a thin film comprising:

forming a thin film by depositing a thin film material on a surface of a substrate with a specified region of the surface of the substrate being selectively heated, the thin film having film properties varying between the heated region and other regions, the substrate having disposed thereon an insulating layer containing a same type of material as the thin film to be formed; and patterning, by etching, the thin film in a self-aligned manner so as to have a pattern corresponding to a pattern of the regions, the etching taking advantage of differences in etching rate between the regions with varying film properties.

2. The method of fabricating a thin film according to claim 1, wherein the substrate is selectively heated by forming, on the substrate, an energy absorber with a predetermined pattern, and subsequently imparting energy to the energy absorber to release heat from the energy absorber.

3. The method of fabricating a thin film according to claim 2, wherein the energy is imparted by irradiating an electromagnetic wave to the energy absorber.

4. The method of fabricating a thin film according to claim 1, wherein the substrate is selectively heated by forming, on the substrate, a conductive film with a predetermined pattern, and subsequently passing an electric current through the conductive film to release heat from the conductive film.

5. The method of fabricating a thin film according to claim 1, wherein the substrate is selectively heated intermittently.

6. The method of fabricating a thin film according to claim 1, wherein the step of forming the thin film employs CVD.

7. The method of fabricating a thin film according to claim 6, wherein the CVD is plasma enhanced CVD.

8. The method of fabricating a thin film according to claim 1, wherein in the step of forming the thin film, with a source gas for a thin film to be formed being supplied to the surface of the substrate, the specified region is heated to a temperature equal to or above a temperature at which the source gas causes a chemical reaction.

9. The method of fabricating a thin film according to claim 1, wherein the thin film is etched by hydrogen radical treatment.

10. A method of fabricating a thin film, comprising:

forming a thin film in a self-aligned manner by providing a thin film material on a surface of a substrate with a specified region of the surface of the substrate being selectively heated, the thin film being formed only in the heated specified region, the substrate having thereon an insulating layer containing a same type of material as said thin film, wherein the substrate is selectively heated by forming, on the substrate, a conductive film or a conductive film with a predetermined pattern, and subsequently passing an electric current through the conductive film to release heat from the conductive film.

11. A method of fabricating a thin film transistor comprising:

forming, on an insulating substrate, a metal thin film with a predetermined pattern;

forming an insulating layer on the metal thin film, the insulating layer containing a same type of material as a semiconductor thin film to be formed;

forming the semiconductor by depositing a thin film material on the insulating layer with a specified region of the insulating layer being selectively heated by imparting energy to the metal thin film to release the energy as heat from the metal thin film, the semiconductor thin film having film properties varying between the heated region and other regions; and patterning, by etching, the semiconductor thin film in a self-aligned manner so as to have a pattern corresponding to a pattern of the regions, the etching taking advantage of differences in etching rate between the regions with varying film properties.

12. The method of fabricating a thin film transistor according to claim 11, wherein the metal thin film serves as a gate electrode or a source electrode and a drain electrode.

13. The method of fabricating a thin film transistor according to claim 11, wherein the specified region of the insulating layer is selectively heated by irradiating an electromagnetic wave, serving as the energy to the metal thin film to release heat from the metal thin film.

14. The method of fabricating a thin film transistor according to claim 11, wherein the insulating layer is selectively heated by passing an electric current through the metal thin film to release heat from the metal thin film.

15. The method of fabricating a thin film transistor according to claim 11, wherein the energy is imparted to the metal thin film intermittently.

16. The method of fabricating a thin film transistor according to claim 11, wherein the step of forming the semiconductor thin film employs CVD.

17. The method of fabricating a thin film transistor according to claim 16, wherein the CVD is plasma enhanced CVD.

18. The method of fabricating a thin film transistor according to claim 11, wherein in the step of forming the semiconductor thin film, with a source gas for a semiconductor thin film to be formed being supplied to a surface of the substrate, the specified region is heated to a temperature equal to or above a temperature at which the source gas causes a chemical reaction.

19. The method of fabricating a thin film transistor according to claim 11, wherein the semiconductor thin film is etched by hydrogen radical treatment.

20. The method of fabricating a thin film transistor according to claim 11, wherein after the step of forming the semiconductor thin film, the semiconductor thin film is crystallized.

21. The method of fabricating a thin film transistor according to claim 20, wherein laser annealing is performed instead of the heat treatment.

22. A method of fabricating a thin film transistor, comprising:

forming, on an insulating substrate, a metal thin film with a predetermined pattern;

forming an insulating layer on the metal thin film, the insulating layer containing a same type of material as a semiconductor thin film to be formed thereon; and forming a semiconductor thin film on a self-aligned manner by depositing a thin film material on the insulating layer with a specified region on the insulating layer being selectively heated by imparting energy of the metal thin film to release the energy as heat from the metal thin film, the semiconductor thin film being formed only in the heated region, wherein the metal thin film serves as a gate electrode or a source electrode and a drain electrode.

23. A method of fabricating a thin film transistor, comprising:

forming, on an insulating substrate, a metal thin film with a predetermined pattern;

forming an insulating layer on the metal thin film, the insulating layer containing a same type of material as a semiconductor thin film to be formed thereon; and forming a semiconductor thin film on a self-aligned manner by depositing a thin film material on the insulating layer with a specified region of the insulating layer being selectively heated by imparting energy to the metal thin film to release the energy as heat from the metal thin film, the semiconductor thin film being formed only in the heated region, wherein the insulating layer is selectively heated by passing an electric current through the metal thin film to release heat from the metal thin film.

24. A method of fabricating a thin film transistor comprising:

forming, on an insulating substrate, a metal thin film with a predetermined pattern;

forming a first semiconductor thin film on the insulating substrate with a specified region of the insulating substrate being selectively heated by imparting energy to the metal thin film to release the energy as heat from the metal thin film, the first semiconductor thin film having film properties varying between a portion covering the metal thin film and other portions;

patterning, by etching, the first semiconductor thin film in a self-aligned manner so as to have a pattern corresponding to the pattern of the metal thin film, the etching taking advantage of differences in etching rate between the regions with varying film properties;

forming, on the insulating substrate having the first semiconductor thin film thereon, a second semiconductor thin film with a higher melting point than the first semiconductor thin film; and crystallizing the second semiconductor thin film by heat treatment with the first semiconductor thin film as growth nucleus.

25. The method of fabricating a thin film transistor according to claim 24, wherein the metal thin film is made of at least one type or two or more types of metal selected from the group consisting of Ni, Pd, Pt, Al, and Ag.

26. The method of fabricating a thin film transistor according to claim 24, wherein the first semiconductor thin film is one of an a-Ge thin film and an a-GeSi thin film, and wherein the second semiconductor thin film is a Si thin film.

27. The method of fabricating a thin film transistor according to claim 24, wherein laser annealing is performed instead of the heat treatment.

28. A method of fabricating a thin film transistor comprising:

forming, on an insulating substrate, a metal thin film with a predetermined pattern;

forming a first semiconductor thin film by imparting energy to the metal thin film to release the energy as heat from the metal thin film so that a deposition rate varies between a region in the vicinity of the metal thin film and other regions, the first semiconductor thin film covering top and side surfaces of the metal thin film;

forming, on the insulating substrate having the first semiconductor thin film thereon, a second semiconductor thin film with a higher melting point than the first semiconductor thin film; and crystallizing the second semiconductor thin film by heat treatment with the first semiconductor thin film as growth nucleus.

29. The method of fabricating a thin film transistor according to claim 28, wherein the metal thin film is made of at least one type or two or more types of metal selected from the group consisting of Ni, Pd, Pt, Al, and Ag.

30. The method of fabricating a thin film transistor according to claim 28, wherein the first semiconductor thin film is one of an a-Ge thin film and an a-GeSi thin film, and wherein the second semiconductor thin film is a Si thin film.

31. The method of fabricating a thin film transistor according to claim 28, wherein laser annealing is performed instead of the heat treatment.

32. A method of fabricating a thin film transistor comprising:

forming, on an insulating substrate, a metal thin film with a predetermined pattern;

forming an insulating layer on the insulating substrate having the metal thin film thereon;

forming a first semiconductor thin film by depositing a semiconductor material on a surface of the substrate with the insulating layer being selectively heated by imparting energy to the metal thin film to release the energy as heat from the metal thin film, the first semiconductor thin film having film properties varying between a heated region and other regions;

patterning, by etching, the first semiconductor thin film in a self-aligned manner so as to have a pattern corresponding to a pattern of the regions, the etching taking advantage of differences in etching rate between the regions with varying film properties;

forming, on the insulating substrate having the first semiconductor thin film thereon, a second semiconductor thin film with a higher melting point than the first semiconductor thin film; and crystallizing the second semiconductor thin film by heat treatment with the first semiconductor thin film as growth nucleus.

33. The method of fabricating a thin film transistor according to claim 32, wherein the metal thin film is made of at least one type or two or more types of metal selected from the group consisting of Ni, Pd, Pt, Al, and Ag.

34. The method of fabricating a thin film transistor according to claim 32, wherein the first semiconductor thin film is one of an a-Ge thin film and an a-GeSi thin film, and wherein the second semiconductor thin film is a Si thin film.

35. The method of fabricating a thin film transistor according to claim 32, wherein laser annealing is performed instead of the heat treatment.

36. A method of fabricating a thin film transistor comprising:

forming, on an insulating substrate, a metal thin film with a predetermined pattern;

forming an insulating layer on the insulating substrate having the metal thin film thereon;

forming a first semiconductor thin film in a self-aligned manner by providing a thin film material to a surface of the substrate with a specified region of the insulating layer being selectively heated by imparting energy to the metal thin film to release the energy as heat from the metal thin film, the first semiconductor thin film being formed only in the specified region;

forming, on the insulating substrate having the first semiconductor thin film thereon, a second semiconductor thin film with a higher melting point than the first semiconductor thin film; and crystallizing the second semiconductor thin film by heat treatment with the first semiconductor thin film as growth nucleus.

37. The method of fabricating a thin film transistor according to claim 36, wherein the metal thin film is made of at least one type or two or more types of metal selected from the group consisting of Ni, Pd, Pt, Al, and Ag.

38. The method of fabricating a thin film transistor according to claim 36, wherein the first semiconductor thin film is one of an a-Ge thin film and an a-GeSi thin film, and wherein the second semiconductor thin film is a Si thin film.

39. The method of fabricating a thin film transistor according to claim 36, wherein laser annealing is performed instead of the heat treatment.

40. An apparatus for fabricating a thin film comprising:

a metal thin film formation means for forming, on a substrate, a metal thin film with a predetermined pattern;

a thin film formation means for forming a thin film by depositing a thin film material on an insulating layer with a specified region on the substrate being selectively heated by imparting energy to the metal thin film on the substrate to release the energy as heat from the metal thin film, the insulating layer being disposed so as to cover the metal thin film and containing a same type of material as a thin film to be formed, the thin film having film properties varying between the heated region and other regions; and an etching means for patterning the thin film in a self-aligned manner so as to have a pattern corresponding to a pattern of the regions, the patterning taking advantage of differences in etching rate between the regions with varying film properties.

41. The apparatus for fabricating a thin film according to claim 40, wherein the thin film formation means comprising:

a reaction vessel for holding the substrate inside;

an electromagnetic wave irradiation portion for irradiating an electromagnetic wave, serving as the energy, to the metal thin film, a supply portion for supplying a source gas to an inside of the reaction vessel, and a reaction excitation portion for exciting a chemical reaction of the source gas.

42. The apparatus for fabricating a thin film according to claim 40, wherein an electric current application portion is provided for intermittently passing an electric current through the metal thin film.

43. The apparatus for fabricating a thin film according to claim 41, wherein the reaction excitation portion is a plasma excitation portion.

44. An apparatus for fabricating a film, comprising:

a metal thin film formation means for forming, on a substrate, a metal thin film with a predetermined pattern; and a thin film formation means for forming a thin film in a self-aligned manner, by depositing a thin film material on an insulating layer with a specified region of the substrate being selectively heated by imparting energy to the metal thin film on the substrate to release the energy as heat from the metal thin film, the insulating layer being disposed so as to cover the metal thin film and containing a same type of material as a thin film to be formed thereon, the thin film being formed only in the heated region on the substrate, wherein an electric current application portion is provided for intermittently passing an electric current through the metal thin film.

* * * * *